(12) United States Patent
Davis et al.

(10) Patent No.: US 12,062,550 B2
(45) Date of Patent: Aug. 13, 2024

(54) MOLDED DIRECT CONTACT INTERCONNECT SUBSTRATE AND METHODS OF MAKING SAME

(71) Applicant: Deca Technologies USA, Inc., Tempe, AZ (US)

(72) Inventors: Robin Davis, Vancouver, WA (US); Timothy L. Olson, Phoenix, AZ (US); Paul R. Hoffman, San Diego, CA (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 18/225,064

(22) Filed: Jul. 21, 2023

(65) Prior Publication Data

US 2023/0386860 A1    Nov. 30, 2023

Related U.S. Application Data

(63) Continuation-in-part of application No. 18/195,090, filed on May 9, 2023, and a continuation-in-part of
(Continued)

(51) Int. Cl.
  *H01L 21/48* (2006.01)
  *H01L 21/56* (2006.01)

(52) U.S. Cl.
  CPC ........ *H01L 21/485* (2013.01); *H01L 21/4853* (2013.01); *H01L 21/565* (2013.01)

(58) Field of Classification Search
  CPC ..... H01L 24/20; H01L 24/19; H01L 2224/19; H01L 2224/21
  See application file for complete search history.

(56) References Cited

U.S. PATENT DOCUMENTS

| 5,570,274 A | 10/1996 | Saito |
| 5,790,384 A | 8/1998 | Ahmad |

(Continued)

FOREIGN PATENT DOCUMENTS

| CN | 112234035 A | 1/2021 |
| KR | 1020150009668 | 1/2015 |

OTHER PUBLICATIONS

Anandan, Ramasamy et al. "Embedded Wafer Level BGA (EWLB)—Extra-Small and ELGA Packages." Electronics Packaging Technology Conference (EPTC), 2011. pp. 412-416.
(Continued)

*Primary Examiner* — Fernando L Toledo
*Assistant Examiner* — Neil R Prasad
(74) *Attorney, Agent, or Firm* — Booth Udall Fuller, PLC; Bryce W. Bumham

(57) ABSTRACT

The disclosure concerns method of making a molded substrate, comprising providing a carrier; forming a first conductive layer and first vertical conductive contacts over the carrier; disposing a first layer of encapsulant over the first conductive layer and first vertical conductive contacts; planarizing the first vertical conductive contacts and the first layer of encapsulant to form a first planar surface; forming a second conductive layer and second vertical conductive contacts over the first layer of encapsulant and configured to be electrically coupled with the first conductive layer and first vertical conductive contacts; disposing a second layer of encapsulant over the second conductive layer and second vertical conductive contacts; planarizing the second vertical conductive contacts and the second layer of encapsulant to form a second planar surface; and forming first conductive bumps over the second planar surface, opposite the carrier.

28 Claims, 21 Drawing Sheets

Related U.S. Application Data application No. 17/957,683, filed on Sep. 30, 2022, now Pat. No. 11,749,534.

(60) Provisional application No. 63/391,694, filed on Jul. 22, 2022, provisional application No. 63/391,315, filed on Jul. 21, 2022, provisional application No. 63/347,516, filed on May 31, 2022.

(56) References Cited

U.S. PATENT DOCUMENTS

| | | | |
|---|---|---|---|
| 6,133,626 | A | 10/2000 | Hawke |
| 6,294,406 | B1 | 9/2001 | Bertin |
| 7,569,422 | B2 | 8/2009 | Lin |
| 8,018,036 | B2 | 9/2011 | Goh |
| 8,164,171 | B2 | 4/2012 | Lin |
| 8,503,186 | B2 | 8/2013 | Lin |
| 8,653,647 | B2 | 2/2014 | Masuda |
| 8,664,044 | B2 | 3/2014 | Jin |
| 8,804,360 | B2 | 8/2014 | Lin |
| 8,860,207 | B2 | 10/2014 | Jin |
| 9,355,945 | B1 | 5/2016 | Ge |
| 9,368,438 | B2 | 6/2016 | Lin |
| 9,385,074 | B2 | 7/2016 | Pendse |
| 9,391,041 | B2 | 7/2016 | Lin |
| 9,553,000 | B2 | 1/2017 | Yu |
| 9,601,463 | B2 | 3/2017 | Yu |
| 9,613,931 | B2 | 4/2017 | Lin |
| 9,685,390 | B2 | 6/2017 | Hu |
| 9,704,735 | B2 | 7/2017 | Konchady |
| 9,793,231 | B2 | 10/2017 | Chen |
| 10,056,351 | B2 | 8/2018 | Yu |
| 10,229,892 | B2 | 3/2019 | Appelt |
| 10,325,879 | B2 | 6/2019 | Yu |
| 10,373,902 | B2 | 8/2019 | Scanlan |
| 10,490,468 | B2 | 11/2019 | Tsai |
| 10,770,416 | B2 | 9/2020 | Kim |
| 10,879,224 | B2 | 12/2020 | Chen |
| 10,886,263 | B2 | 1/2021 | Chen |
| 11,024,605 | B2 | 6/2021 | Chen |
| 11,171,076 | B2 | 11/2021 | Yu |
| 11,211,360 | B2 | 12/2021 | Huang |
| 11,276,656 | B2 | 3/2022 | Chen |
| 11,502,062 | B2 | 11/2022 | Chen |
| 2010/0290191 | A1* | 11/2010 | Lin ................ H01L 24/82 361/764 |
| 2014/0124937 | A1 | 5/2014 | Wu |
| 2014/0335658 | A1 | 11/2014 | Scanlan |
| 2019/0304938 | A1 | 10/2019 | Hadizadeh |
| 2019/0333893 | A1 | 10/2019 | Yu |
| 2019/0341351 | A1 | 11/2019 | May |
| 2020/0058627 | A1* | 2/2020 | Chen ............ H01L 23/3135 |
| 2020/0266184 | A1* | 8/2020 | Pietambaram ...... H01L 21/486 |
| 2021/0066263 | A1 | 3/2021 | Chen |
| 2021/0366854 | A1* | 11/2021 | Yu ................ H01L 23/481 |
| 2021/0366877 | A1* | 11/2021 | Wu ............... H01L 23/5384 |
| 2022/0005760 | A1 | 1/2022 | Dadvand |

OTHER PUBLICATIONS

Boettcher, Lars et al. Next Generation System in a Package Manufacturing by Embedded Chip Technologies. Additional Conferences (Device Packaging, HiTEC, HiTEN, & CICMT). 2010.

Boettcher, Lars et al. "Embedding of Chips for System in Package Realization—Technology and Applications." 2008. pp. 383-386.

Braun, Tanja et al. "Fan-Out Wafer and Panel Level Packaging as Packaging Platform for Heterogeneous Integration." Micromachines. 2019. vol. 10, pp. 342.

Jin, Yonggang et al. "Development and Characterization of Next Generation EWLB Embedded Wafer Level BGA) Packaging." ECTC, 2012. pp. 1388-1393.

Jin, Yonggang et al. "Enhanced Fan-Out WLP for High Power Device Packaging." International Electronics Manufacturing Technology Conference (IEMT), 2012.

Kurita, Yoichiro et al. "Fan-Out WLP With Highly Flexible Design Capabilities." 3rd Electronic System-Integration Technology Conference (ESTC), Sep. 13-16, 2010.

Ma, Yiyi et al. "Thermal Cycling Reliability Assessment and Enhancement of Embedded Wafer Level LGA Packages for Power Applications." Electronic Packaging Technology Conference (EPTC), 2012. pp. 606-611.

Motohasi, N., et al. System in Wafer Level Package Technology with RDL first process, 2011 Electronic Components and Technology Conferencepp 59-64.

Stahr, Hannes et al. "Embedded Components on the Way to Industrialisation." 2011. https://ats.het/wp-content/uploads/2017/03/SMTA_Austin_TX_2011_ECP_Paper.pdf.

* cited by examiner

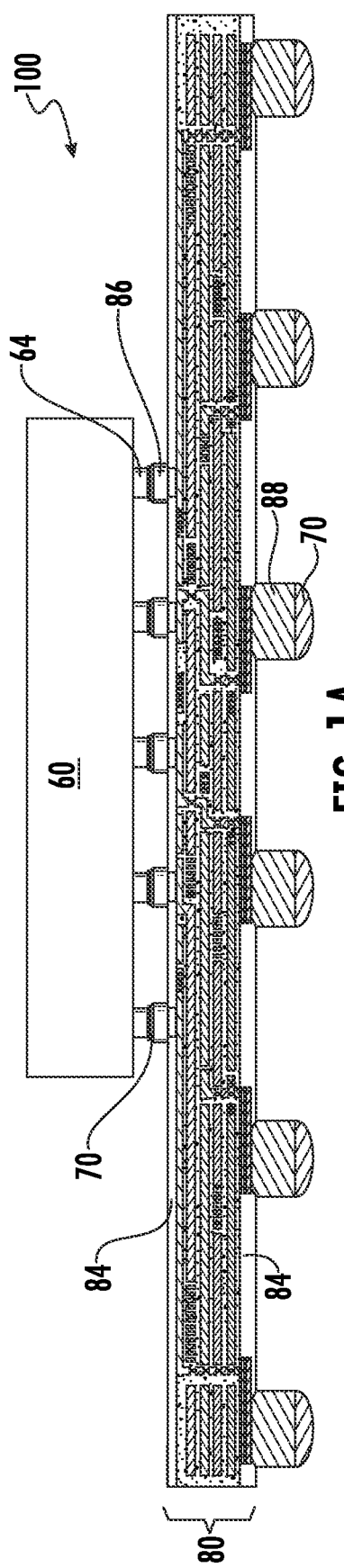
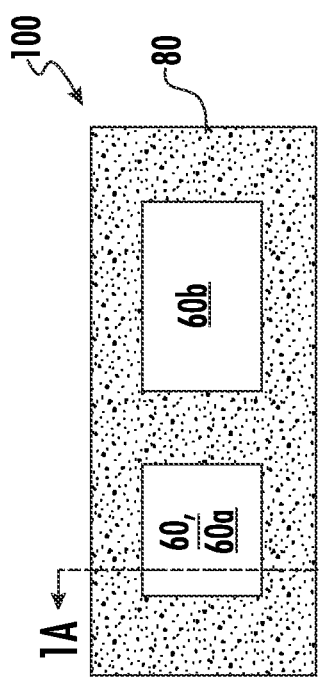
FIG. 1A
FIG. 1B

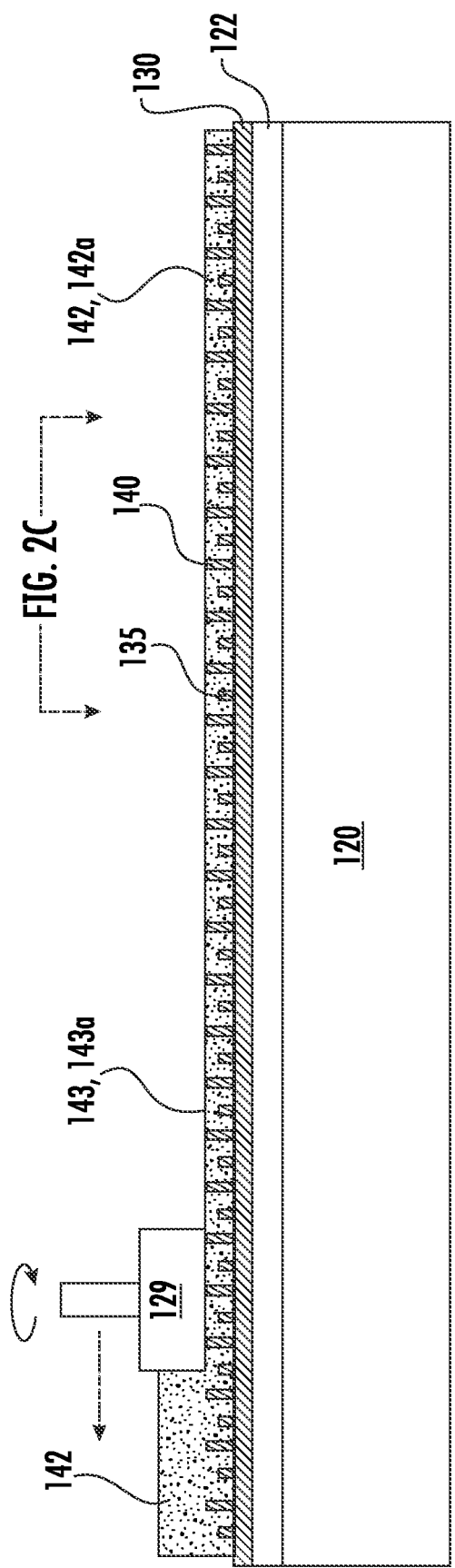

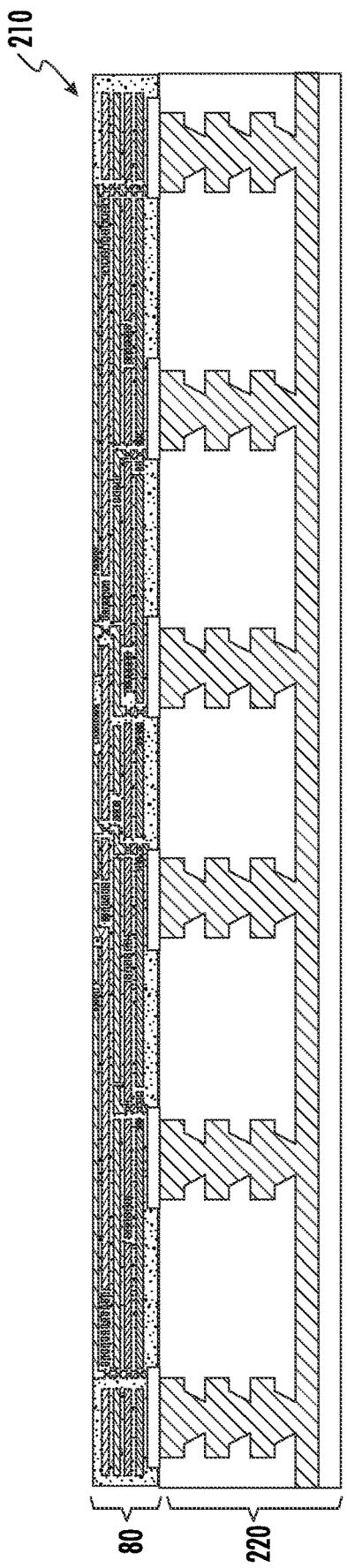
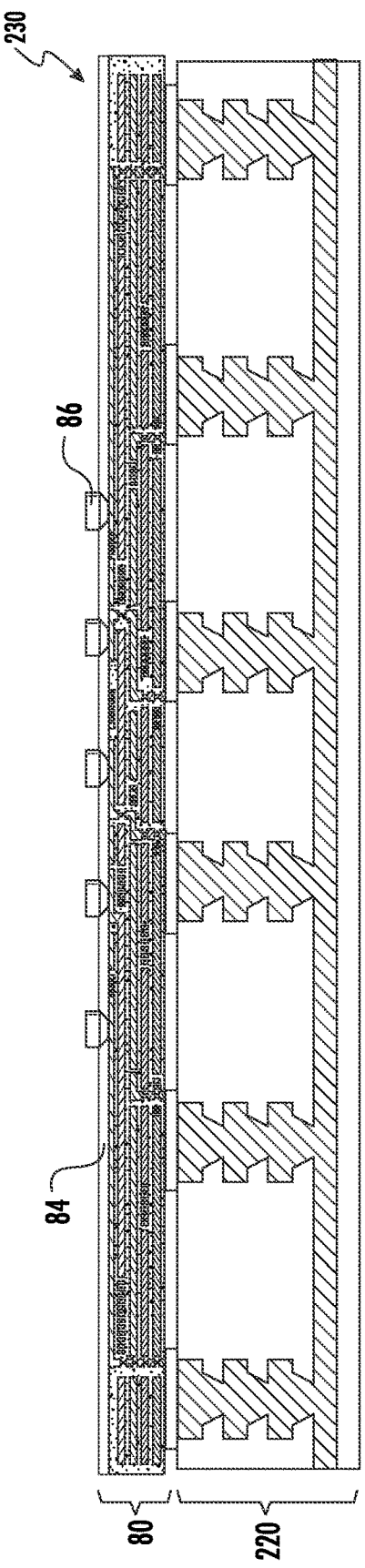
FIG. 4A
FIG. 4B

MOLDED DIRECT CONTACT INTERCONNECT SUBSTRATE AND METHODS OF MAKING SAME

CROSS-REFERENCE TO RELATED APPLICATIONS

This disclosure claims the benefit, including the filing date, of U.S. Provisional Patent No. 63/391,694, entitled "Molded Direct Contact Interconnect Substrate," which was filed on Jul. 22, 2022, the entire disclosure of which is hereby incorporated herein by this reference; and this disclosure is also a continuation-in-part of U.S. Utility application Ser. No. 18/195,090 entitled "Molded Direct Contact Interconnect Structure Without Capture Pads and Method for the Same," which was filed on May 9, 2023, and which claims the benefit of U.S. Provisional Patent No. 63/347,516, entitled "Molded Direct Contact Interconnect Build-up Structure Without Capture Pads," which was filed on May 31, 2022, the entirety of the disclosures of which are hereby incorporated herein by this reference; and this disclosure is also is a continuation-in-part of U.S. Utility application Ser. No. 17/957,683 entitled "Quad Flat No-lead (QFN) Package Without Leadframe and Direct Contact Interconnect Build-up Structure and Method for Making the Same," which was filed on Sep. 30, 2022, and which claims the benefit of U.S. Provisional Patent No. 63/391,315, entitled "Quad Flat No-lead (QFN) Package Without Leadframe and Direct Contact Interconnect Build-up Structure Without Capture Pads and Methods for Making the Same," which was filed on Jul. 21, 2022, the entirety of the disclosures of which are hereby incorporated herein by this reference.

TECHNICAL FIELD

This disclosure relates to electrical assemblies and more particularly to molded direct contact interconnect substrates and build-up structures, such as for use with semiconductor structures, devices, and packages, and methods of making same.

BACKGROUND

Semiconductor assemblies, devices, packages, substrates, and interposers are commonly found in modern electronic products. Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment, as well as in other fields and applications.

SUMMARY

In some aspects, the disclosure concerns methods of making molded substrates, comprising: forming a first conductive layer and first vertical conductive contacts over a carrier; disposing a first layer of encapsulant around the first conductive layer and first vertical conductive contacts; planarizing by polishing and grinding the first vertical conductive contacts and the first layer of encapsulant to form a first planar surface; forming a second conductive layer over the first layer of encapsulant and second vertical conductive contacts on the second layer and configured to be electrically coupled with the first conductive layer and first vertical conductive contacts; disposing a second layer of encapsulant around the second conductive layer and second vertical conductive contacts; and planarizing by grinding and polishing the second vertical conductive contacts and the second layer of encapsulant to form a second planar surface. In some embodiments, the encapsulant was planarized to within 5 to 500 nanometers.

In some embodiments, the carrier comprises a temporary carrier or sacrificial carrier. In other embodiments, the carrier comprises a permanent carrier which remains coupled with the molded substrate. In certain embodiments, the carrier comprises printed circuit board (PCB).

Some embodiments further comprise forming a conductive bump configured to be electrically coupled through one or more of the vertical contacts and the semiconductor chip. Yet other embodiments further comprise forming alternating layers of additional conductive layers and vertical conductive contacts with alternating layers of encapsulant to form up to 12 layers of conductive layers and vertical conductive contacts.

In certain embodiments, the first conductive bumps comprise one or more of an input electrical contact, an output electrical contact, an IO contact, a bump, a solder ball, a solder bump, a BGA, a LGA, land pads, copper pillars, and copper pillars with solder, to couple with devices outside the semiconductor device. "IO" in this instance is not restricted to signal contacts but may also encompass power, ground, source, clock, drain, gate, emitter, collector, base, cathode, anode or contacts.

Some embodiments, further comprising forming second conductive bumps opposite the first conductive bumps.

The encapsulant may comprise a mold compound, a composite material, such as epoxy resin with filler, epoxy acrylate with filler, polytetrafluoroethylene (PTFE) which is also known under the trademark Teflon™, or other low k dielectrics (which for the purposes of this disclosure comprise materials with a dielectric constant (Dk) or relative permittivity below about 3.6 Dk, and is not a polymer material such as polyimide that does not perform well in a grinding operation.

Some vertical conductive contacts are formed with a minimum diameter—or greatest width—of the cross-sectional area (regardless of whether the cross-sectional area is circular or not) may be less than or equal to 12 μm and at a minimum pitch of less than or equal to 25 μm. Some first conductive layers comprise a redistribution layer (RDL) with a line and space width of less than or equal to 5 μm.

Certain embodiments, further comprise forming alternating layers of additional conductive layers and vertical conductive contacts with alternating layers of encapsulant to form two to eight layers of conductive layers and vertical conductive contacts.

Planarizing the encapsulant may be done to within 5 to 500 nanometers.

Some embodiments, further comprise forming one or more of the first conductive layer and the second conductive layer to further comprise one or more power planes, thermal delivery system, a power delivery system, shielding for all or part of the substrate, patterned metal in any shape, including for inductors, antenna, and markings for identification.

Certain embodiments further comprise a molded substrate formed on opposing sides of the carrier. Some embodiments further comprise forming each of the molded substrates on opposing sides of the carrier with 1-8 layers of conductive material.

Some embodiments further comprise the molded substrate formed with an embedded bridge chip replacement.

Other aspects concerns methods of making a molded substrate, comprising providing a carrier; forming a first conductive layer over the carrier; disposing a first layer of encapsulant around the first conductive layer and first vertical conductive contacts; and planarizing the first vertical conductive contacts and the first layer of encapsulant to form a first planar surface. In some embodiments, the first vertical conductive contacts are formed with a minimum diameter less than or equal to 12 μm and at a minimum pitch of less than or equal to 25 μm.

Some embodiments further comprise forming the first conductive layer to further comprise first vertical conductive contacts. Certain embodiments, further comprise forming the first conductive layer to further comprise one or more large power planes, a power delivery system shielding for all or part of the substrate, patterned metal in any shape, including for inductors, antenna, markings for identification.

Some embodiments have one or more layers of encapsulant are mold compounds or are provided by a molding process.

In certain embodiments, any of the conductive layers or vertical conductive contacts are patterned by adaptive patterning or laser direct imaging.

Some embodiments, further comprising forming one or more of the first conductive layer and the second conductive layer to further comprise one or more of traces, planes, including stripline, microstrip, coplanar waveguide, coplanar waveguide with a ground plane, controlled impedance traces, or differential pair traces.

Some embodiments comprise a conductive pad adjacent the surface of the substrate includes at least one layer of encapsulant locked between at least two layers of conductive material.

Certain embodiments comprise a conductive pad adjacent the surface of the substrate includes at least two layers of encapsulant interlocked between at least three layers of conductive material.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that they can be their own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

BRIEF DESCRIPTION OF THE DRAWINGS

FIGS. 1A-1D illustrate various view of a molded substrate comprising components coupled thereto.

FIGS. 4A-4B illustrate instances of a molded substrate being formed on a conventional substrate or printed circuit board (PCB).

Figure 1C:
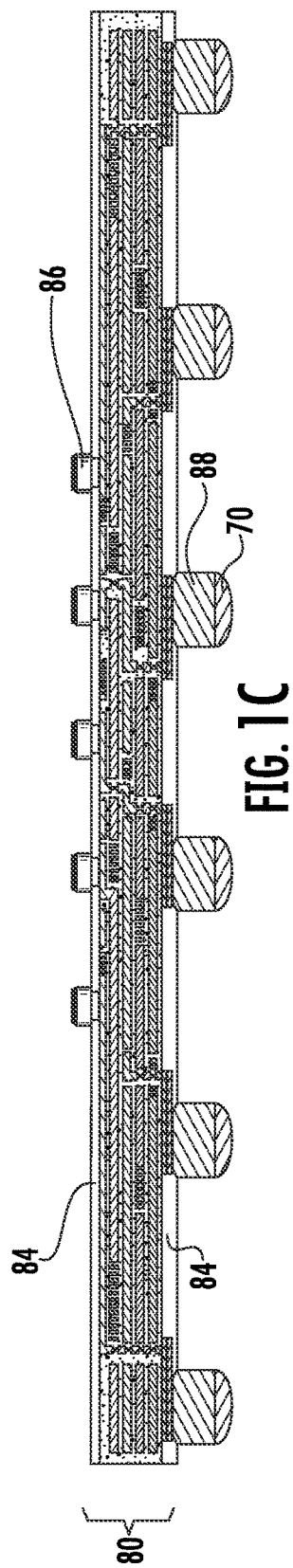

Skilled artisans will appreciate that elements in the figures are illustrated for simplicity and clarity and have not necessarily been drawn to scale. For example, the dimensions of some of the elements in the figures may be exaggerated relative to other elements to help to improve understanding of implementations.

DESCRIPTION

This disclosure relates to molded direct contact interconnect substrates and build-up structures (hereinafter "molded substrates"), such as for use with semiconductor structures, devices, and packages. In some instances, the molded direct contact interconnect substrates may comprise one or more layers of molded substrates coupled with one or more conventional substrates. The molded substrate may include routing for semiconductor devices comprising different pitches, such as high density and ultra-high density as described more fully herein.

Molded direct contact interconnect substrates (and method for making and using the same) may comprise or provide: (i) 2 micrometer line and space routing, (ii) removal of capture pads for vias between build-up layers, such as traces, and (iii) facilitate ultra-high-density connections.

Molded substrates also provide other advantages, including the formation of custom and use specific substrates, providing additional design options when being used with (or stacked on, in, or between) conventional substrates (such as circuit boards, printed circuit boards (PCBs) (whether single layer, double layer, multi-layer, high density interconnect (HDI), high frequency, formed with a core or without a core (coreless), with or without a mesh or glass weave reinforcement, rigid, flexible, rigid-flex, laminates, interposers, or any other substrate or support material).

Molded substrates further provide the additional advantages of conductive layers within the molded substrate being formed as more features within the molded substrate (e.g. more than copper or conductive posts), and further include: (i) vertical conductive interconnects, stump layers, power planes and power delivery systems, (ii) shielding for all or part of the molded substrate (such as when shielding is only for part of the molded substrate, the shielding may be targeted for high energy, high frequency, RFID, or for other application specific needs or operations), and (iii) patterned metal in any shape, including for inductors, antenna, markings for identification, such as part number, manufacture date or location, or other desired information.

Other features may also (but need not be) be formed within, adjacent, above, or below the molded substrate, including passive devices, integrated passive devices (IPDs), molded components, or other features included with the molded substrate. Molded components may comprise embedded devices, active devices, a semiconductor chip comprising an active layer, an IPD, or a passive device, silicon devices, integrated circuits, bridge chip, inductors, capacitors, and resistors, for power management, RF signal processing, clocking or devices for other functions. In some instances, the molded substrate will be formed without any molded components. Without molded components the molded substrate (or portions thereof may operate more as a conventional substrate or PCB and include conductive features for routing of electrical signals, the conductive features being formed as one or more studs, interconnects, routing layers, and redistribution layers.

At least some of the above advantages are available at least in part by using unit specific patterning (such as patterning (custom lithography) and build-up interconnect structures such as a frontside build-up interconnect structure, which is also known under the trademark "Adaptive Patterning," referred to as "AP." Unit specific patterning: (i) allows for the use high-speed chip attach for semiconductor chip and AP will ensure alignment for high density interconnects with the molded direct contact interconnect build-up structures; and (ii) allows for automated optical inspection (AOI) and defect identification with the possibility for defect repair, which may include laser direct imaging (LDI) and plating for opens and may further include laser cut for shorts.

This disclosure, its aspects and implementations, are not limited to the specific package types, material types, or other system component examples, or methods disclosed herein. Many additional components, manufacturing and assembly procedures known in the art consistent with semiconductor wafer fabrication, manufacture and packaging are contemplated for use with particular implementations from this disclosure. Accordingly, for example, although particular implementations are disclosed, such implementations and implementing components may comprise any components, models, types, materials, versions, quantities, or the like as is known in the art for such systems and implementing components, consistent with the intended operation. The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

In the following description, reference is made to the accompanying drawings which form a part hereof, and which show by way of illustration possible implementations. It is to be understood that other implementations may be utilized, and structural, as well as procedural, changes may be made without departing from the scope of this document. As a matter of convenience, various components will be described using exemplary materials, sizes, shapes, dimensions, and the like. However, this document is not limited to the stated examples and other configurations are possible and within the teachings of the present disclosure. As will become apparent, changes may be made in the function, arrangement, or both of any of the elements described in the disclosed exemplary implementations without departing from the spirit and scope of this disclosure.

FIGS. 1A-1D illustrate a molded substrate 100 comprising one or more components 60 mounted or coupled thereto. In some embodiments, the component 60 may be a chip, semiconductor chip, die, semiconductor die, surface mount technology (SMT), or flip chip. Each component 60 may comprise a backside or back surface and an active layer opposite the backside. The active layer contains one or more circuits or discrete components of any kind implemented as active devices, or only conductive layers, and dielectric layers formed within or on the component 60 and electrically interconnected according to the electrical design and function of the component 60. For example, the circuit may include, without limitation, one or more transistors, diodes, and other circuit elements formed within active layer to implement analog circuits or digital circuits, such as DSP, ASIC, memory, or other signal processing circuits. The component 60 may also contain IPDs such as inductors, capacitors, and resistors, for RF signal processing. The component 60 may be a semiconductor chip formed on a native wafer in a wafer level process as one of many packages being formed simultaneously on a carrier. In other instances, the component 60 may be formed as part of a reconstituted wafer and may comprise multiple chips molded together. The component 60 may be an active chip, and in other instances may be formed without an active layer, for example as a bridge chip with only electrical routing and with copper studs of the semiconductor chip electrically connected or coupled with wiring, routing, or RDLs. The component 60 may also be only dummy silicon with no electrical function, but rather act as structural silicon and may or may not include copper studs. In some instances, both faces of the chip will be active. The component 60 may comprise conductive interconnects, studs, or bumps 64 that can be formed as one or more of bumps, thick pads, columns, pillars, posts, or conductive stumps that are disposed over the component 60. In some instances, the conductive studs may be coupled or connected to contact pads over the active layer of the semiconductor chip, when present.

In some instances, the temporary carrier 120 may be a metal carrier, a silicon carrier, a glass carrier, or a carrier made of other suitable material used for the molding or encapsulating process. The temporary or sacrificial carrier 120 may be removed such as by grinding or activating a release layer, after the encapsulant 142 over the carrier 120 provides sufficient structural support and the encapsulant 142 is no longer needed for support, wherein the encapsulant 142 may be any suitable material, such as mold compound, filled epoxy film such as ABF, or other dielectric such as polyimide has been placed, cured, or both, such that the encapsulant 142 provides structural support and the temporary carrier 120 is no longer needed for processing. The carrier 120 may be of any suitable or desired size, such as panel of about 600 millimeters (mm) by 600 mm, or a panel having sides of less than 600 mm, such as 400 mm or 300 mm, as well as a wafer with circular or roughly circular footprint with a diameter or maximum width of about 400 mm or 300 mm. The carrier 120 may also be, or comprise one or more, strips with side lengths of less than or equal to about 300 mm, 200 mm, 150 mm, or 100 mm.

The component or semiconductor chip 60 may be placed adjacent one another, such as in a side-by-side arrangement, and subsequently coupled together. Multiple components 60 may also be processed together at a same time over the temporary carrier 120, which will be understood by a person of ordinary skill in the art (POSA), even when a close-up view of just portions of the assembly 100 are shown.

FIG. 1A illustrates an electronic assembly 100 comprising a component 60 mounted on a molded substrate or molded build-up interconnect structure 80. The component 60 comprises a conductive interconnect or bump 64 that contacts a conductive pad 86 of the build-up interconnect structure 80. On the opposite side of the molded substrate 80 from the component 60, the molded substrate 80 comprises an insulating, passivation or dielectric layer 84 and a conductive interconnect or bump 88 with solder 70 disposed at a distal end of the conductive interconnect 88. One or more components 60 may be mounted face-up or face-down to the molded substrate 80 as part of the electronic assembly 100. In some instances, the electronic assembly 100 will include the substrate 80 comprising both a PCB and molded layers being formed over the PCB, as shown and described, e.g., with respect to FIGS. 5A-5C.

FIG. 1B presents a top or plan view that is perpendicular to the view of FIG. 1A, wherein the electronic assembly 100 comprises more than one component 60 coupled to the build-up interconnect structure 80. More specifically, FIG. 1B shows a plan view of a first component 60a and a second component 60b attached to the build-up interconnect structure 80. FIG. 1B also includes a section line 1A, from which the cross-sectional profile view of FIG. 1A is taken.

FIG. 1C illustrates a cross-sectional profile view of a molded substrate 80 with conductive pads 86, and on an opposite side of the molded build-up interconnect structure 80, an insulating, passivation, or dielectric layer 84 and conductive interconnects 88 or bump with solder 70 at an end of the conductive interconnect 88 remote from build-up interconnect structure 80. Pads 86 at the surface of the molded substrate 80, in addition to being used for mounting components 60 thereto, may also be used as connectors or for being contacted as a socket or test probe. In some instances, the pads 80 may comprise a pad finish or solderable metal surface (SMS) or organic solderability preservative (OSP). Additionally, pads 86 may also be wirebondable (e.g., gold (Au), alladium (Pd), or silver (Ag). In some instances, pad finishes use or comprise a 'hard' finish, such as hard gold for connectors and test contact pads. In other instances, pad finishes use "soft" gold, such as are good for wirebonding. Components 60 may be mounted to, or onto, the substrate 80, using one or more of flip chip attach, die attach or direct attach, wire bonding, soldering, conductive paste, and conductive film.

Figure 1D:
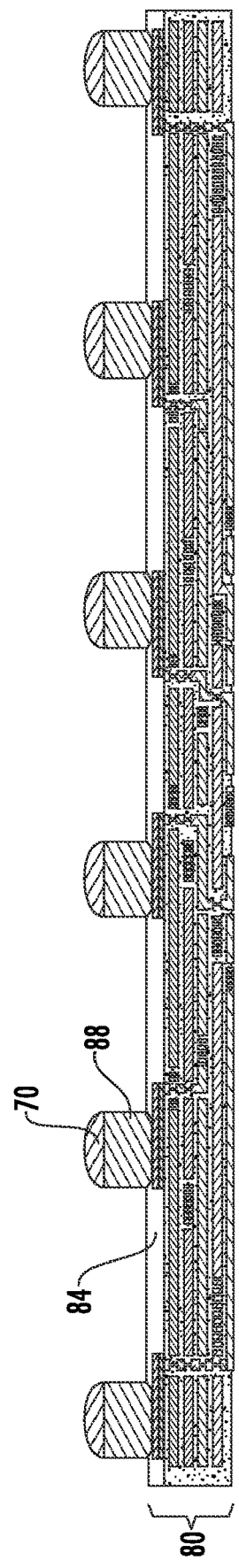

FIG. 1D differs from FIG. 1C by the omission of conductive pads or bumps 86, which may be absent, or may be subsequently added. FIG. 1D illustrates a cross-sectional profile view of a molded substrate 80 with an insulating, passivation, or dielectric layer 84 and a conductive interconnect 88 or bump with solder 70 at an end of the conductive interconnect 88 remote from build-up interconnect structure 80.

Figure 2A:
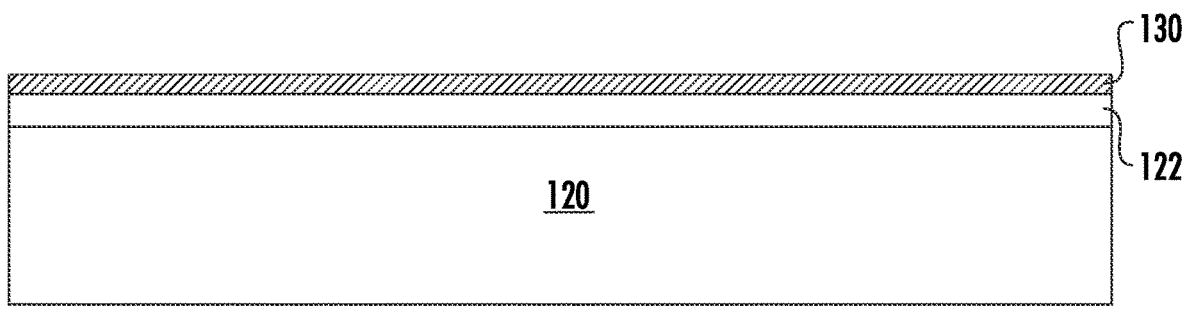
FIGS. 2A-2V illustrate various stages of a molded substrate being formed over a substrate or temporary carrier.

FIG. 2A illustrates a carrier or substrate 120 that that may be used for the formation of the molded substrate 80. In some instances, the carrier 120 may be a reusable carrier, a sacrificial carrier, or any suitable carrier that may be a metal carrier, a silicon carrier, a glass carrier, or a carrier made of mold compound, encapsulant, or other suitable material, which may further comprise a release layer. The carrier 120 may be used for the molding or encapsulating process, and then be removed after the encapsulant, such as mold compound, epoxy mold compound (EMC), a composite material, such as epoxy resin with filler, epoxy acrylate with filler, filled epoxy film such as Ajinomoto Build-Up Film® (ABF)), or other dielectric such as polyimide has been placed, cured, or both, such that the encapsulant provides structural support and the temporary carrier is no longer needed for processing. In some instances, the carrier 120 may comprise a printed circuit board (PCB) that may be sacrificial, or alternatively some or all of which may remain and become a part of the molded substrate 80.

FIG. 2A further shows that in some instances an interface layer 122 may be disposed between the carrier 120 and the seed layer 130. The seed layer 130 may be used for the subsequent formation of conductive layers within the molded substrate 80, such as by electroplating.

The interface layer 122, when present, may provide temporary adhesion to the Molded build-up interconnect structure 80. The interface layer 122 may be one or more of a standard die attach liquid epoxy, other liquid adhesive, an adhesive film or tape, or a thermal release material, a thermal release tape, a UV release material, or a UV release tape that is disposed between the components and the intermediate carrier.

FIG. 2B illustrates a cross-sectional side view of forming a first conductive layer (trace, RDL, pad, plane, flag, or other structure) 135 and first vertical conductive contacts 140 over a seed layer 130. The first conductive layer 135 and first vertical conductive contacts 140 may be formed using PVD, CVD, electrolytic plating, electroless plating process, or other suitable metal deposition process. The seed layer 130 may utilize the same material and methods used to form the first conductive layer 135 and the first vertical conductive contacts 140. The first conductive layer 135 and first vertical conductive contacts 140 may be one or more layers of copper (Cu), aluminum (Al), tin (Sn), nickel (Ni), gold (Au), silver (Ag), titanium (Ti), Platinum (Pt), Tungsten (W) or other suitable electrically conductive material. The first conductive layers 135 and vertical conductive contacts 140 may be electrically conductive, thermally conductive, or both. The first conductive base may reside on an interface layer, adhesive, or tape 122 which resides on a carrier 120. For simplicity, the interface layer 122 and the carrier 120 are not shown on all of the figures that follow that show buildup of the conductive features.

Vertical conductive contacts 140 may be formed as conductive studs or conductive stumps which are conductive interconnect structures that may have generally vertical sides and be wider than tall. A conductive stud or stump 140 may differ from a pillar or post, each of which may have a height greater than its width. A conductive stud or stump 140 may comprise a cylindrical shape and may further be formed with a cross-sectional area that is circular, oval, octagonal, or as any polygonal or other shape and size. A conductive stud or stump 140 may be used for electrical interconnect, signal transmission, power, ground, or as a dummy thermal element that is not electrically coupled to an active electrical circuit but is instead thermally coupled to a heat source of an active device to dissipate the heat to another structure, such as to a die pad on a surface of the component 60. The generally vertical sides of a conductive studs or stumps 140 are different from the sides shape that exists for a solder ball or a compressed or outwardly deformed solder ball that has generally rounded sides. The generally vertical nature of a conductive studs or stumps 140 comes from being formed in a structure that has been previously developed or etched, such as within openings in a photoresist layer, which will also be generally vertical. Sides of the conductive stud or stump 140 may comprise imperfections or irregularities in shape that result from the developing or etching process, the photoresist material, or other materials and processes used. For example, developing or etching does not generally perfectly or uniformly remove the photoresist within the openings, and therefore forms imperfect, generally vertical openings for deposition of the conductive stud or stump. The term "generally vertical" as used herein includes perfectly vertical and imperfectly vertical sides or sides that are about or substantially vertical or at an angle typically greater than 45 degrees. A conductive stud or stump 140 is not a wire bond and is not solder.

Figure 2C:
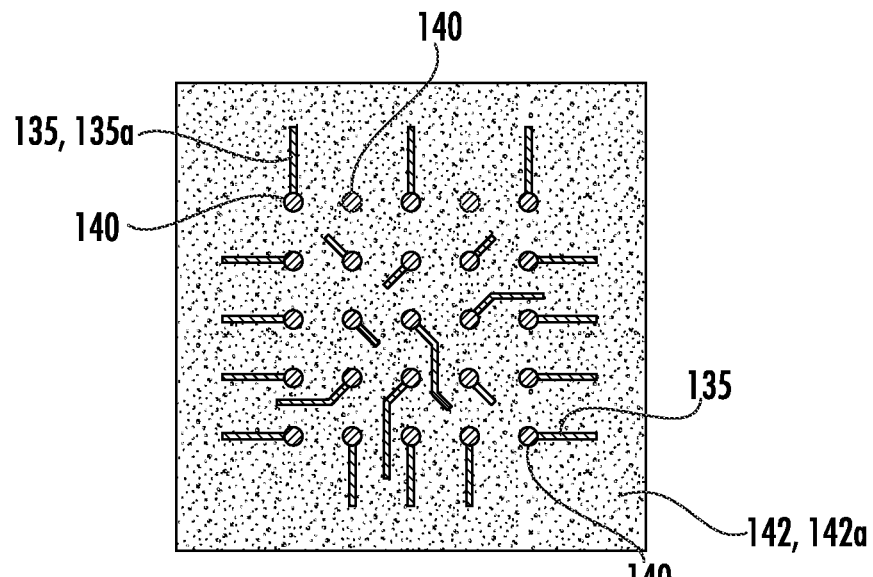

FIG. 2C illustrates a top or planar view of an analogous structure to FIG. 2B, with the first conductive layer 135 formed over the carrier 120.

FIGS. 2B and 2C further illustrate the first conductive layer 135 can be formed as a trace or redistribution layer (RDL) comprising line and space of less than or equal to 2 μm for a pitch of less than or equal to 4 μm, or in other instances comprising line and space of less than or equal to 5 μm for a pitch of less than or equal to 10 μm.

The first vertical conductive contacts may also be formed at a same time as the conductive layer 135 (such as with a single-part or two-part plating processes). In the single plating process the following steps of features may be present: (i) forming a seed layer, (ii) forming and patterning a first photoresist or resist layer for the conductive layer 135 (or RDL), (iii) forming and patterning a second photoresist or resist layer for the first vertical conductive contacts 140 (or studs) or other conductive pattern, (iv) plating the conductive layer and the first vertical conductive contacts 140, (v) stripping or removing the photoresist, (vi) etch or remove the seed layer. Alternately, the process may be performed by (i) forming a seed layer, (ii) forming and patterning a first photoresist or resist layer for the conductive layer 135 (or RDL), (iii) plating the conductive layer 135, (iv) forming and patterning a second photoresist or resist layer for the first vertical conductive contacts 140 (or studs) or other conductive pattern, (vi) plating the first vertical conductive contacts 140, (vi) stripping or removing the photoresist, and (vi) etching or removing the seed layer. Additional alternate flows are possible to achieve the desired plated structure.

FIG. 2B illustrates that after formation of the conductive layer 135 and the first vertical conductive contacts 140, an encapsulant 142 or a first layer of encapsulant 142a, may be formed over the carrier 120, and over and around the conductive layer 135 and over and around the first vertical conductive contacts 140.

The encapsulant 142 may comprise a polymer composite material, such as epoxy resin with filler commonly referred to as epoxy molding compound or EMC, epoxy acrylate with filler, ABF (Ajinomoto Build-up Film®), or other polymer with proper filler. The encapsulant 142 may also comprise a flowable or non-flowable encapsulant or mold compound. For example, the encapsulant 142 may comprise an EMC which is a very flowable but has less filler. In other instances, encapsulant 142 with more filler could be used, which would make the encapsulant less flowable.

In certain embodiments, the planar surface 143 of the encapsulant layer 142a (or more specifically, the first planar surface 143a of the first encapsulant layer 142a) comprises a roughness less than 500 nanometers (nm) over a characteristic measurement distance. In some embodiments, after a sufficient number of layers of encapsulant 142 have been formed and the molded substrate 80 reaches a desired thickness and strength, the large carrier 120 may be removed. In some instances, the carrier 120 is removed after the molded substrate 80 is complete.

After disposing (and optionally curing) the encapsulant 142, the encapsulant layer 142 can undergo a grinding or chemical mechanical polishing (CMP) process with grinder 129. This is true of the first encapsulant 142a and any subsequent number of additional layers of encapsulant 142n or 142n+1. The grinding, or front grind, to remove a portion of the encapsulant 142 may form a substantially planar surface 143, or first planar surface 143a, over the first encapsulant layer 142a and the first conductive layer 125a. The substantially first planar surface 143a may comprise ends or exposed ends of the first vertical conductive contacts 140a and a planar surface of the first encapsulant layer 142a. The planarizing or grinding of the encapsulant produces a flatness of within a range of about 5-5000 nanometers (nm) or 100-500 nm across the planarized surface. The planar surface of the first encapsulant layer may comprise a roughness less than 500 nm over a characteristic measurement distance. The characteristic measurement distance is defined by the ISO 4288 standard, an entirety of which is hereby incorporated by reference. The characteristic measurement distance may also be a distance great enough to characterize the roughness, such as to a generally accepted level of certainty, and in some instances could be a distance of three times the distance of the roughness. While conventional encapsulant grinding might be done with less flatness, greater accuracy and precision can be obtained by using integrated sensors such as laser, acoustic, or other non-contact methods to control the grinding resulting in better flatness.

The first vertical conductive contacts 140a exposed at the first planar surface 142a may undergo an etching process with the rest of the planar surface 143a to remove metallic or copper residue that results from the grinding process. As a result, the first vertical conductive contacts 140a may be recessed with respect to the planar surface at a distance of, or about, 1-1,000 nm. As used herein, "about" or "substantially" means a percent difference less than or equal to 50% difference, 40% difference, 30% difference, 20% difference, 10% difference, or 5% difference.

Figure 2D:
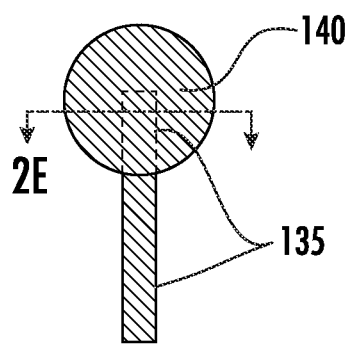
Figure 2E:
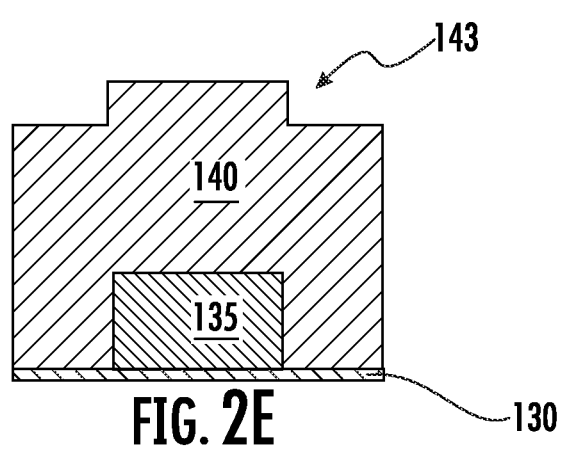

FIG. 2D illustrates a plan view of a topography of an upper surface of a vertical conductive contact 140 (e.g., first vertical contact 140a) that may result from a plating process where the vertical conductive contact 140 is plated over the conductive layer or trace 135, e.g., first conductive layer or trace 135a. FIG. 2E presents a cross-sectional side view 143 of FIG. 2D, including first vertical conductive contacts 140a and the first conductive layer 135a over the seed layer 130. As illustrated, the upper surface of the vertical conductive contact may be roughly the same as that of the conductive layer or trace over which it is plated. The non-planar topography of the upper portion of the vertical conductive contacts may be planarized in a subsequent grinding step.

Figure 2F:
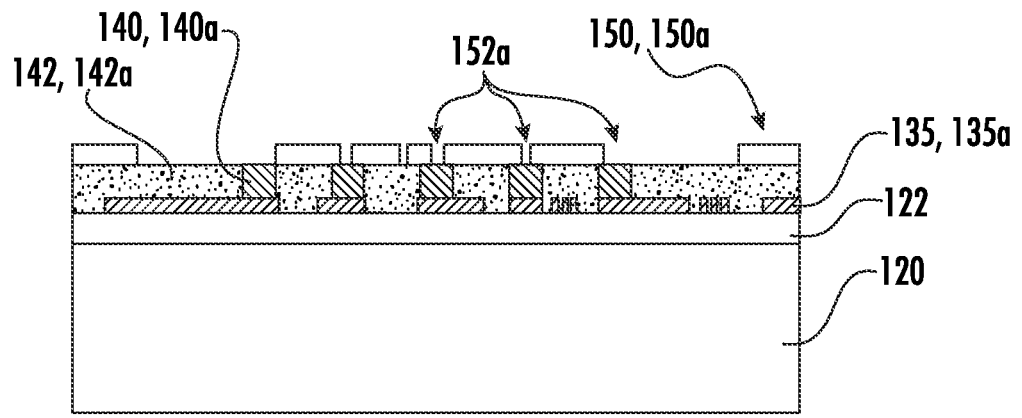
Figure 2G:
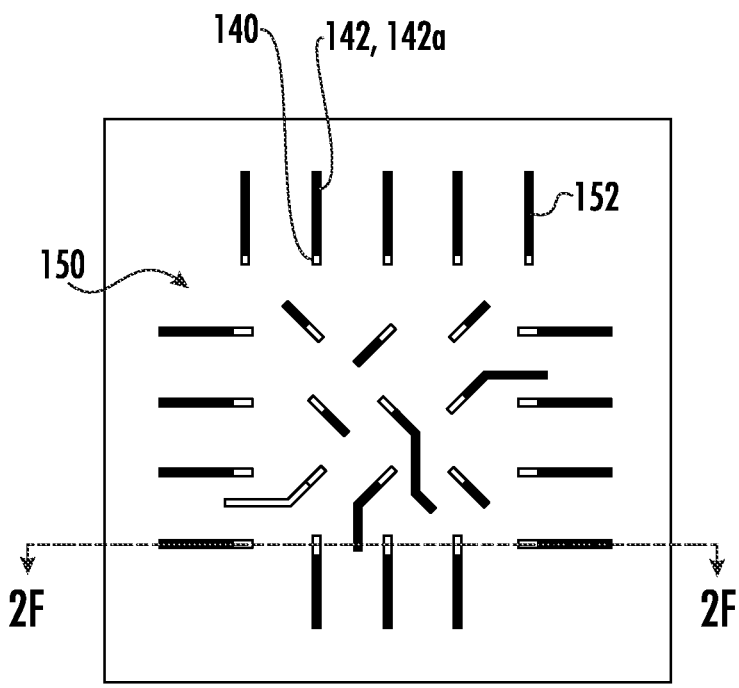
Figure 2H:
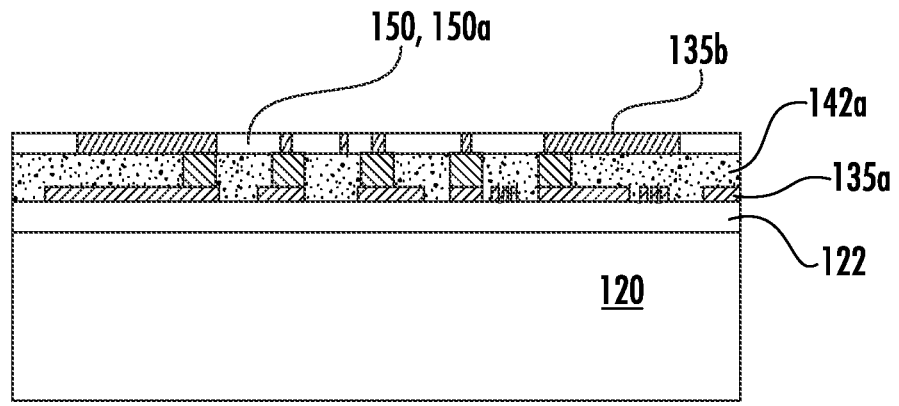
Figure 2I:
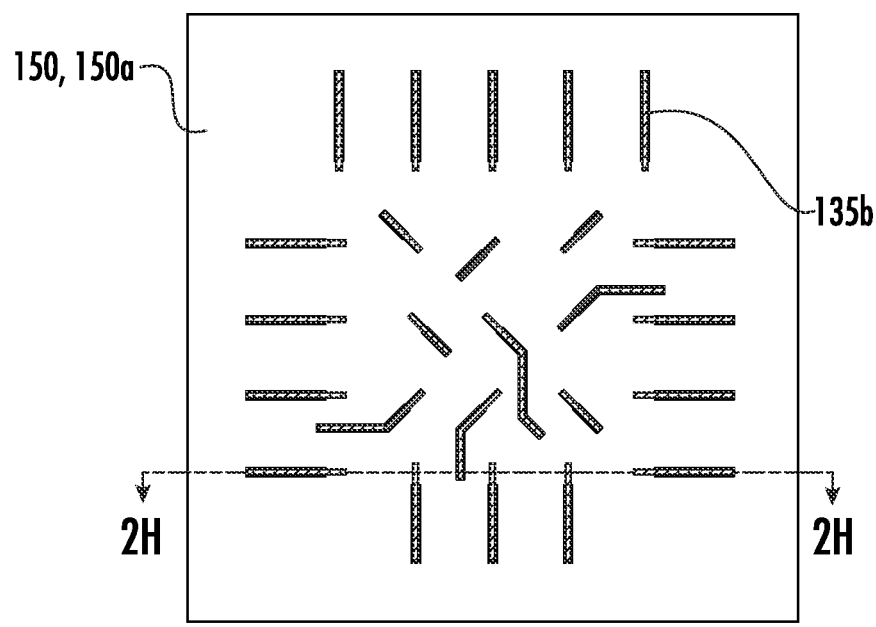

In a single plate method (where the conductive layer 135 and the vertical contacts 140 are formed at a same time or in a same process) as well as in a dual-plate method or process (where the conductive layer 135 and the vertical contacts 140 are formed at a same time or in a same process), the following steps or features may be present. (i) A conductive seed layer may be formed, wherein the same seed is used in the plating processes for both the conductive layer 135 and the conductive contacts 140. Note that the seed layer may be the same or similar to the seed layer 130 shown in FIG. 2B. However, for simplicity of illustration, the seed layer 130 is omitted from subsequent illustration, as are subsequent seed layers that may be used for any number of conductive layers 135 (such as conductive layers 135a-135e, or 135n+1, and vertical conductive contacts 140a-140e, or 140n+1). For ease of reference, subsequent layers of a same or similar feature or material may be denoted by using the same reference number, followed by a letter or subscript (e.g., a-e, n+1). (ii) A first resist or photo resist layer 150, 150a with openings 152, 152a may be formed that may be used for the formation of conductive layer or RDL 135b, as illustrated in FIGS. 2F and 2G. (iii) The conductive layer 135b may be plated using the conductive layer and the first resist layer 150a, as illustrated in FIGS. 2H and 2I. Note that a resist layer 150 (not shown in FIG. 2B), may also be used in the formation of the first conductive layer 135a, which is shown in FIG. 2B.

Figure 2J:
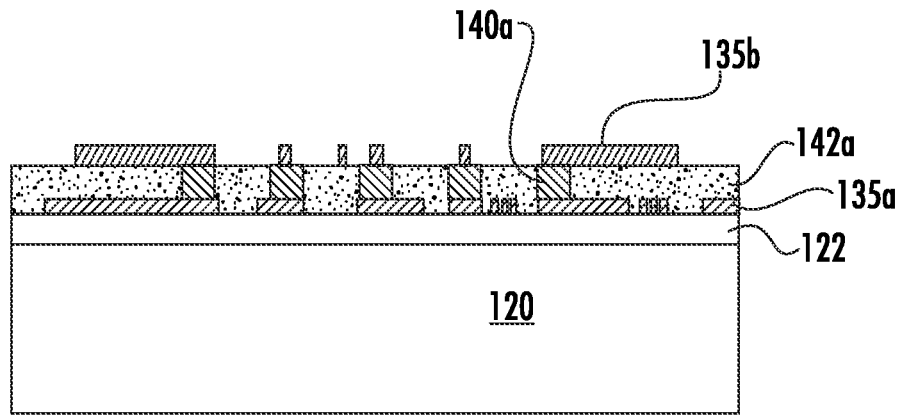
Figure 2K:
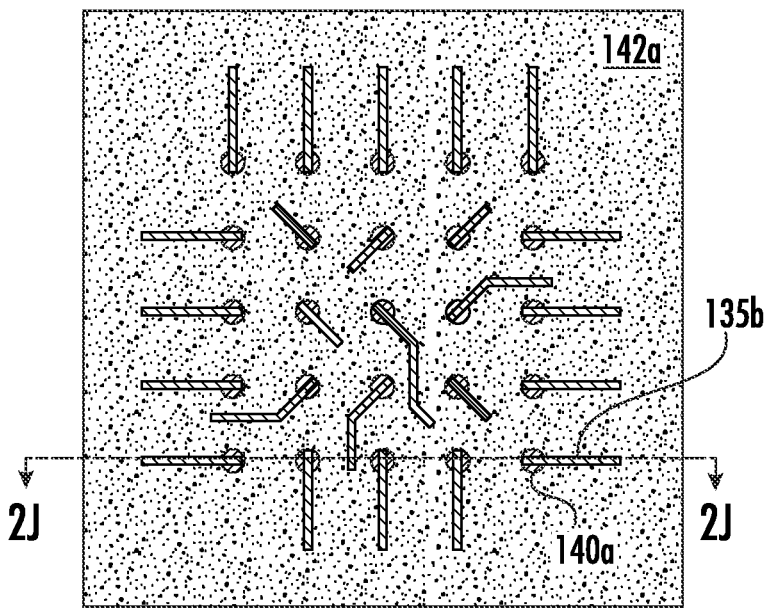
Figure 2L:
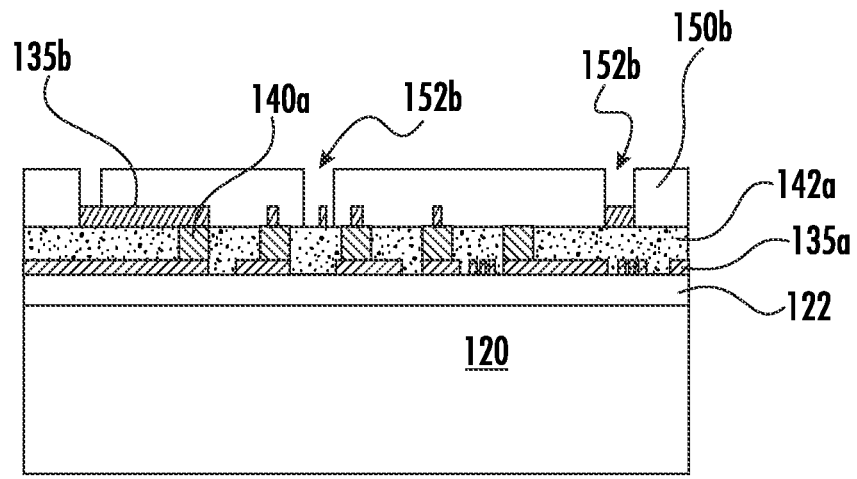
Figure 2M:
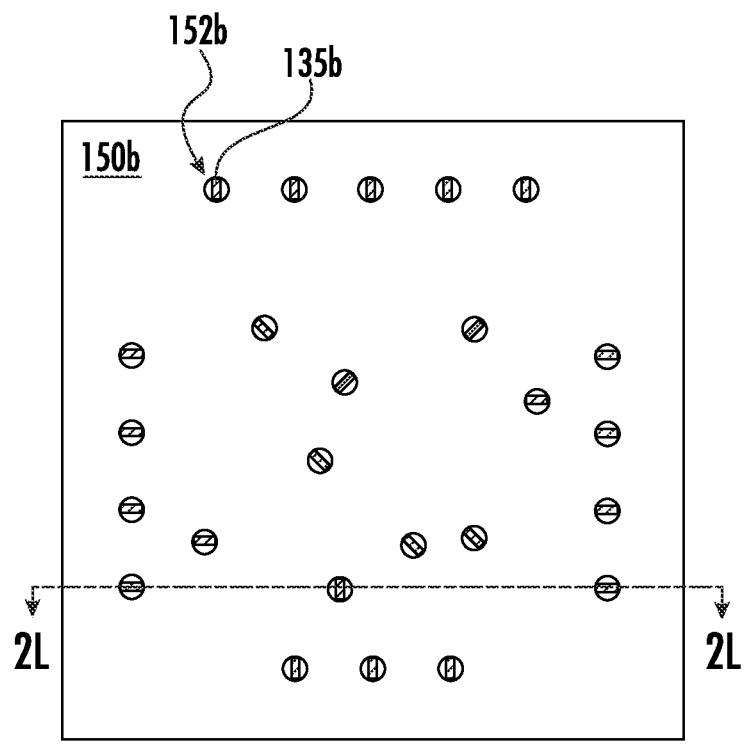
Figure 2N:
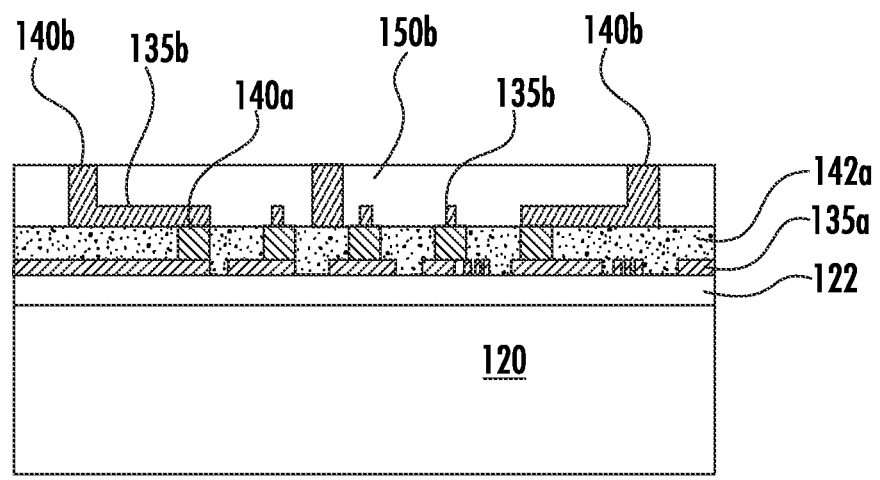
Figure 2O:
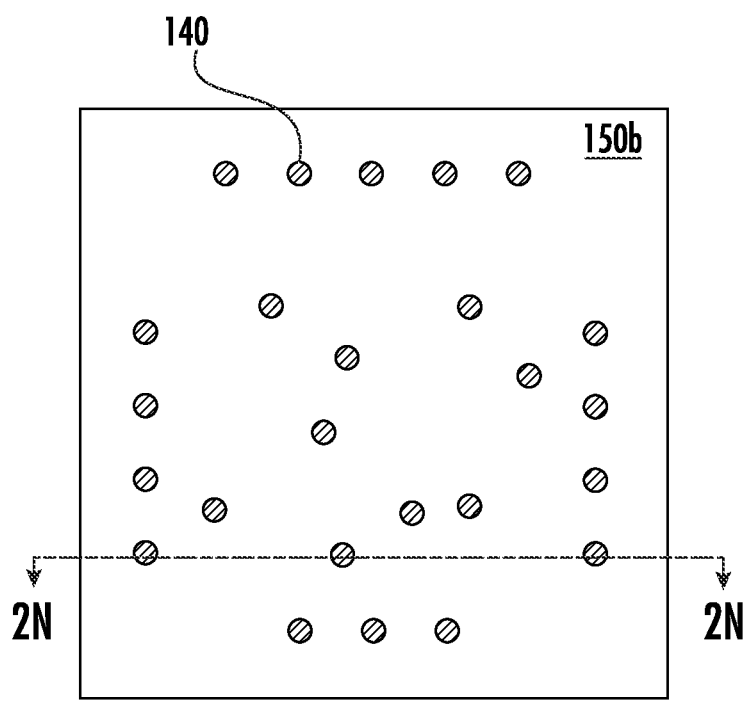
Figure 2P:
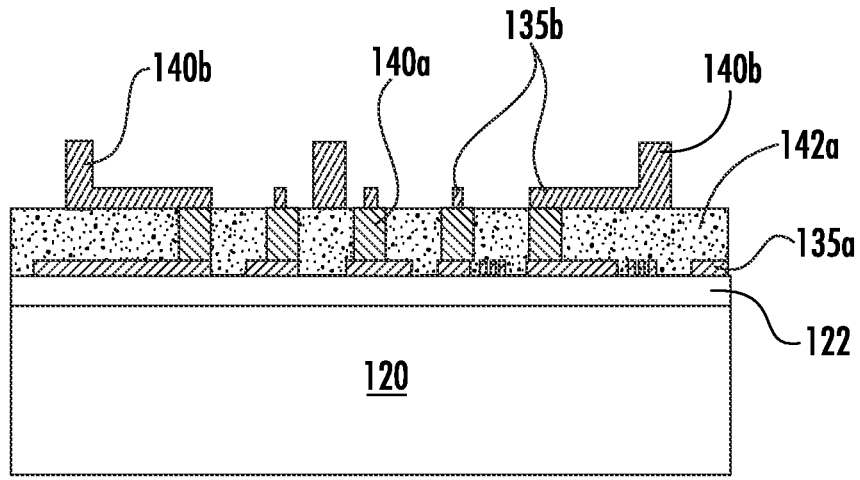
Figure 2Q:
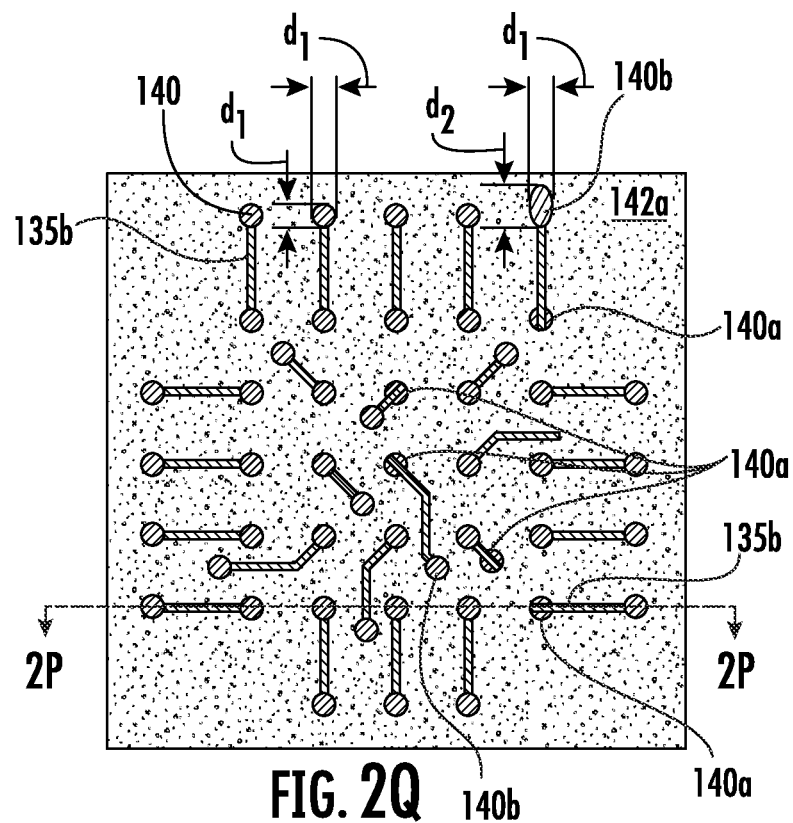

The process may further comprise (iv) striping the first resist 150a, as illustrated in FIGS. 2J and 2K. (v) The second resist or photo resist layer 150b with openings 152b may be formed and patterned for the second vertical conductive contacts 140b, as illustrated in FIGS. 2L and 2M. (vi) The second vertical conductive contacts 140b may be formed or plated, as illustrated in FIGS. 2N and 2O. As illustrated in FIGS. 2P and 2Q, (vii) the second resist 150b may be removed or stripped, and (viii) the seed layer may also be removed or etched. The vertical conductive contacts 140, including the second vertical conductive contacts 140b, may be formed with a minimum diameter less than or equal to about 12 μm or 5 μm and at a minimum pitch of less than or equal to about 25 μm or 10 μm. The second conductive layer 135b may comprise a redistribution layer (RDL) (or other feature without redistribution) with a line and space width of 2 μm or smaller.

Figure 2R:
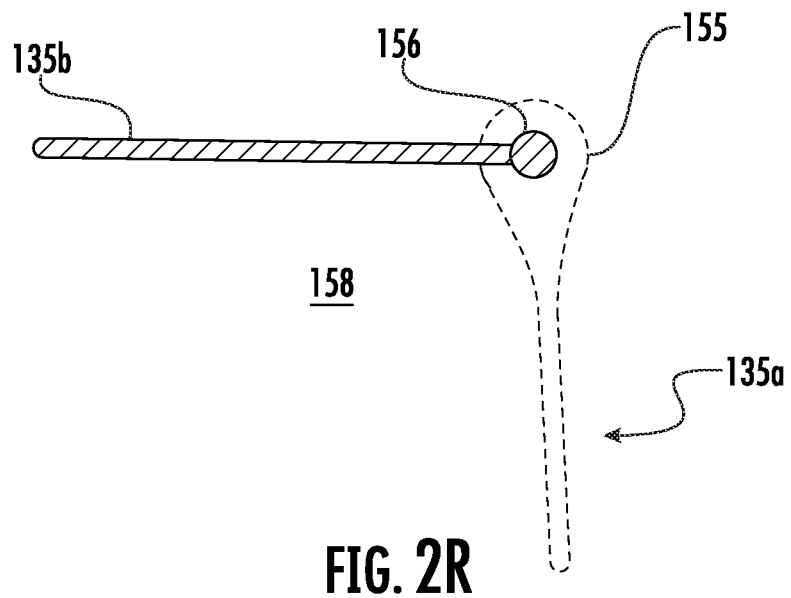
Figure 2S:
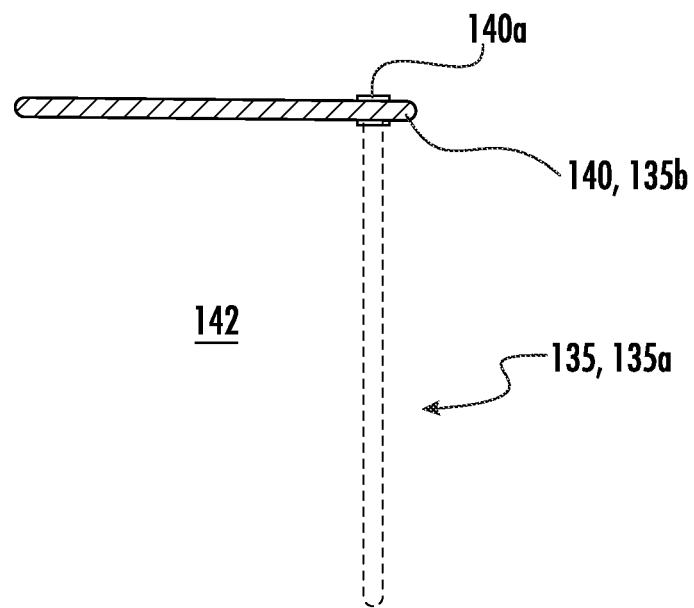

FIGS. 2R and 2S illustrate a difference between an aspect of the instant disclosure (FIG. 2S) versus conventional structures (FIG. 2R). FIG. 2R illustrates how in conventional structures, large contact pads 155 are used to allow for significant tolerance in making contacts between vertically separated or vertically offset layers. A first or lower layer comprising conductive layer or conductive trace 135a and contact pads 155 (shown in dashed lines) is coupled with a second or higher layer comprising conductive layer or conductive trace 135b. Lower conductive trace 135 is coupled with higher conductive trace 135b through contact pad 155 and vertical connecting element or via 156. To accommodate the size and footprint of contact pad 155, additional spacing and an increased pitch are needed. On the other hand, FIG. 2S. illustrates the smaller footprint needed for conductive stump 140, which can be formed without the larger capture pad 155 using unit specific patterning or Adaptive Patterning™ for direct alignment with trace 135a. Unit specific patterning may use scanning and software to make adjustments that avoid the need for large conventional contact pads 155. In some embodiments, design software may adjust an x-y position or rotation of the patterned feature. The design software may create the unit-specific pattern design by selecting from a discrete number of design options or dynamically generating a new or custom unit-specific pattern. As a result, use of vertical conductive contacts or conductive stumps 140 as part of a molded substrate 80 (FIG. 2S) provides an added benefit of tighter or smaller spacing and pitch among conductive layers and features 135 with respect to conventional structures using contact pads 155 (FIG. 2R).

Additionally, FIG. 2R illustrates an instance in which a deformable insulating or passivating layer 158 is used in construction of conventional devices. The deformable insulating layer 158 is disposed around, and supports, both the conductive layers 135 and the vertical connecting elements or vias 156. Thereby the deformable insulating layer 158 assists in making a structure that facilitates connections between conductive layers 135 by using the contact pads 155 and the vertical connecting elements or vias 156. In conventional structures, like that shown in FIG. 2R, the deformable insulting or passivating layer 158 may be a polymer or polyimide that typically (but not always) does not support grinding. Grinding of the conventional insulting or passivating layer 158 can gum-up a grinder, not be cleanly removed so that a smooth surface is not produced, and otherwise be problematic for grinding and removal process, which are therefor avoided. In contrast, FIG. 2S shows a smaller conductive stump or vertical conductive contact 140 can be ground with the encapsulant 142 in a grinding process.

In FIG. 2S, the first vertical conductive contacts 140 cross-sectional area, as seen in top or plan view, that may be circular, square, oval, octagonal, or any other polygonal or desirable shape. The diameter—or greatest width—of the cross-sectional area of first (or any subsequent) vertical conductive contacts 140 (regardless of whether the cross-sectional area is circular or not) may be less than or equal to 8 μm. The first vertical conductive contacts may be at a pitch of less than or equal to 20 μm.

Figure 2T:
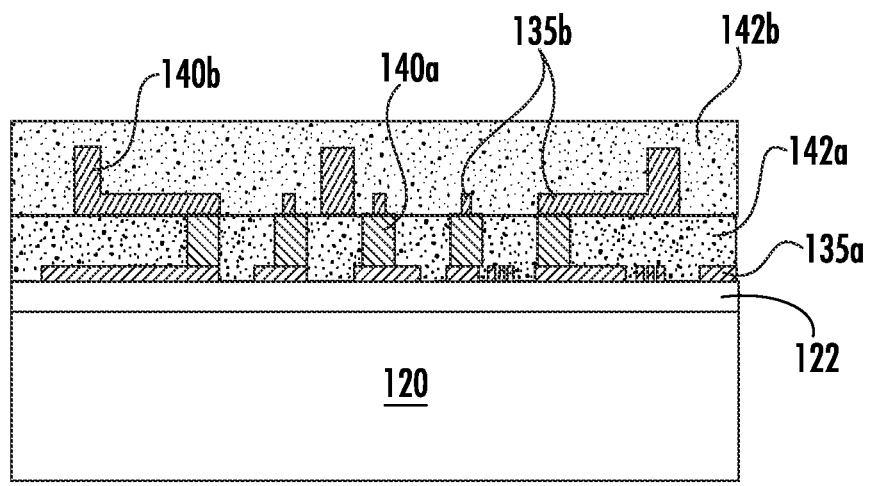

FIG. 2T illustrates disposing a second encapsulant layer 142b around the second conductive layer 135b, second vertical conductive contacts 140b, and over the first encapsulant layer 142a. The second encapsulant layer 142b may be similar, identical, or different than the first encapsulant layer. In any event, the second encapsulant layer 142 will support grinding of the encapsulant and second vertical conductive contacts or stumps 140b to form a second planar surface 143b, as shown in FIG. 2U.

Figure 2U:
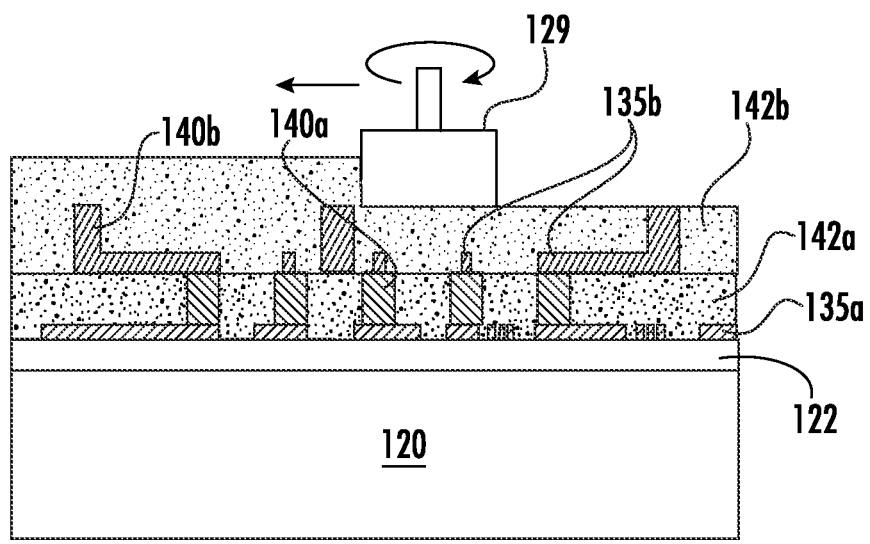
Figure 2V:
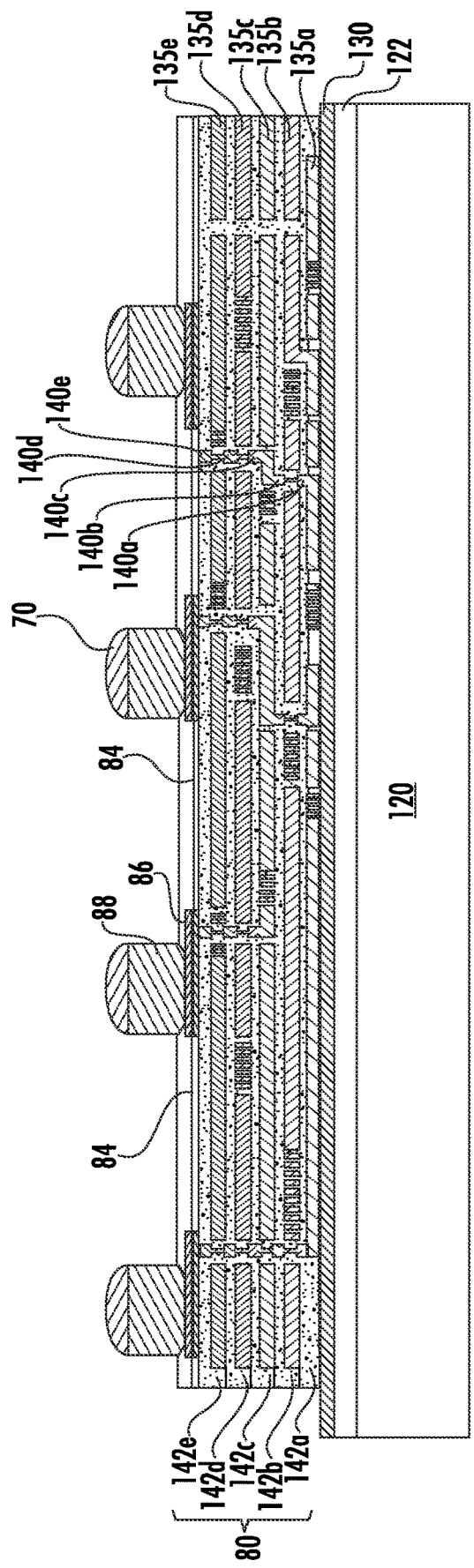

FIG. 2V, continuing from FIG. 2U, illustrates a zoomed out cross-sectional profile view of the final structure or assembly 100 comprising a molded substrate 80, portions of which having been shown in the preceding FIGs. In FIG. 2V, the molded substrate 80 is positioned on seed layer 130 (not shown) that resides on an interface layer 122 that resides on a carrier 120. Continuing build-up pattern discussed with respect to the earlier figures, additional build-up layers of the molded substrate 80 can be added to the structure shown in FIG. 2U. The additional build-up layers may include: (i) conductive layers 135, such as conductive layers 135c-135e, (ii) additional vertical conductive contacts or stumps, such as vertical conductive contacts or stumps 140c-140e, and (iii) additional encapsulant layers, such as encapsulant layers 142c-142e. While 5 layers of conductive layers 135, vertical conductive contacts or stumps 140, and encapsulant 142 are shown in FIG. 2V, any number of desired layers of the materials may be used, including up to 6, 12, 18, 24 or more layers of conductive layers and vertical conductive contacts, or to any desirable number of layers. Planarizing may occur after each layer of encapsulant is formed or disposed.

FIG. 2V further illustrates forming: (iv) an insulating, passivation, or dielectric layer 84, and (v) a conductive pad 86 and a conductive contact 88 over (or as part of) the molded substrate 80. The molded substrate 80 is configured to be electrically coupled to other substrates, PCBs, assemblies, devices, chips, or other structures, through one or more of the conductive interconnects 88 and conductive pads 86, as shown, e.g. in FIG. 1A. The conductive interconnects 88 may comprise one or more of input-output (IO) electrical contacts, power or ground electrical contacts, a bump, a solder ball, a solder bump, a BGA, copper pillars, and copper pillars with solder, conductive polymer bumps, and nickel bumps to couple with devices outside the package. In other cases, there may be LGA pads or land pads provided to couple with devices outside the package.

By forming molded direct contact interconnect build-up structures 80 with encapsulant 42, rather than deformable insulting or passivating layer 158, such as polymers or polyimide, as described herein, significant cost savings may be achieved. A cost of conventional packaging of a semiconductor chip may have roughly half of its cost associated with, or driven by, roughly 10 materials. The most expensive material can be polyimide, accounting for 10-20% of total package cost. The encapsulant 42, such as is used in place of the polyimide for the molded direct contact interconnect build-up structures 80 is much less expensive than the polyimide, accounting for roughly 1-2% of total package cost. Thus, the molded direct contact interconnect build-up structures 80 with encapsulant 42 may be roughly 5× to 10× cheaper, or one-fifth to one-tenth the cost, for using encapsulant 42 rather than polyimide.

Figure 3A:
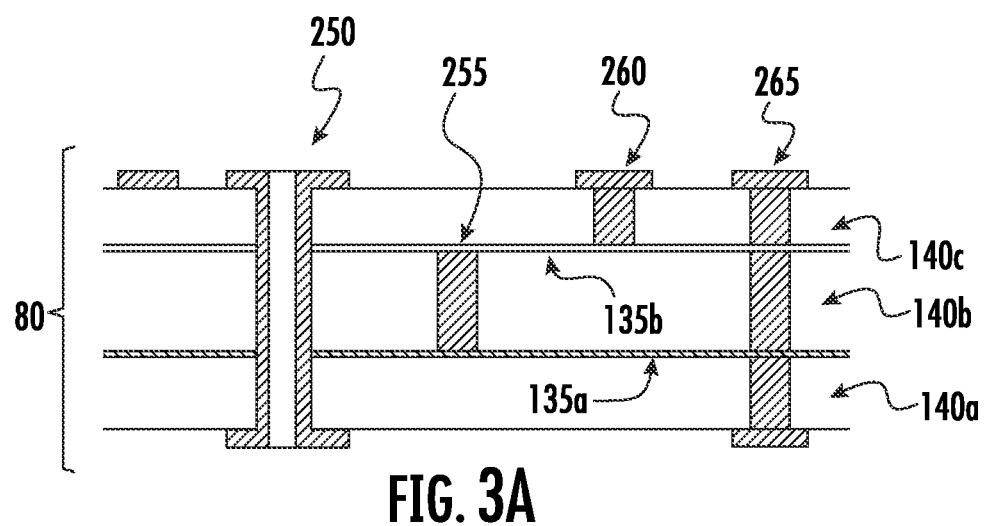
FIGS. 3A-3E illustrate various instances of vias, pads, and channels that may be incorporated within the molded substrate.

FIG. 3A illustrates examples of various via types that may be used in the molded substrates 80 described herein. In some embodiments, a through hole via 250 can extend through the entire substrate 80. Through hole vias 250 can be used for electrical connection or for mechanical purposes. Substrates 80 can also comprise buried vias 255. Buried vias 255 are positioned between conductive layers 275 in the interior of the substrate 80 and do not extend to the exterior, or are not exposed at outer surfaces of the substrate 80. Other vias may be blind vias 260. Blind vias 260 extend to one exterior surface but stops at some interior position and do not extend to the opposite surface. Yet other vias may be stacked vias 265. Such vias are positioned to be aligned with another via.

Figure 3B:
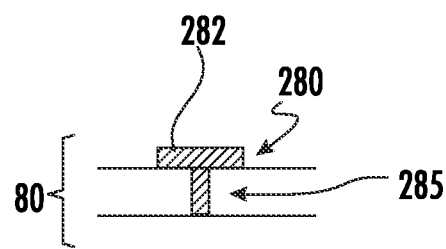

Another via concept, via in pad 280, is illustrated in FIG. 3B. Traditionally vias were kept outside of the bond pads because they can make the pad non-planer and bonding or reliability could be negatively affected. Via in pad 280 is an arrangement in which the via 285 is positioned under the pad 282 to form a via in pad 280, which as a combined structure, can alleviate the problem of non-planarity and reductions in bonding quality.

In certain embodiments, a flexible circuit can be attached to a rigid substrate, in which either all or part of the rigid substrate, the flexible substrate, or both, comprise a molded substrate 80. In some embodiments, desired components can be disposed within the substrate 80, such as by being attached or placed in a desired position, and then molded in place. The components may also be coupled or attached before being molded, such as by solder, pins, adhesive, mechanical fasteners, or in any other suitable fashion.

Some substrates my include materials specific for high resistance (to form resistors, for example) or materials with specific electromagnetic or magnetic properties embedded in the molded layers. Such layers may be applied physically (by screen printing, for example) or other deposition (CVD or sputtering, for example).

Figure 3C:
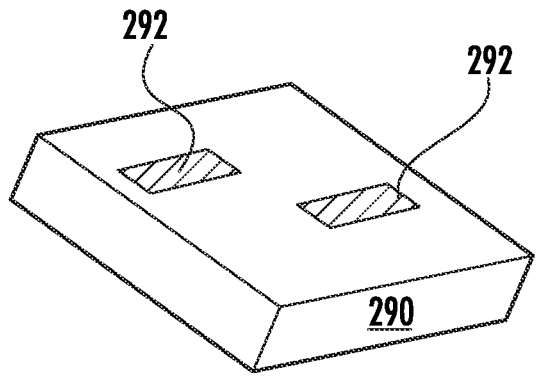
Figure 3D:
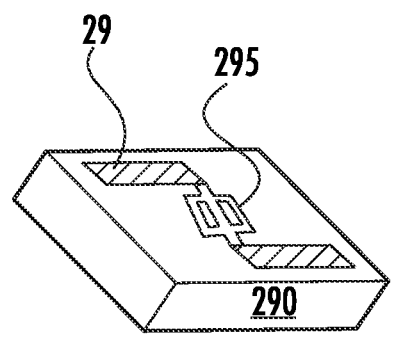
Figure 3E:
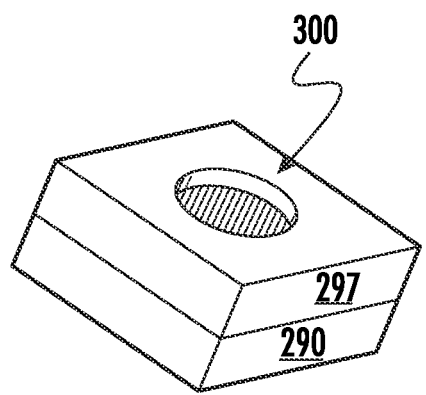

Yet other aspects include microfluidic devices 290 comprising molded-in wells or fluid channels 300 for applications such as biological assays. As illustrated in FIGS. 3C-3E, a molded-in well 300 can be disposed over, coupled with, or in communication with, an applied sensor 295 or other sensing material which contacts one or more traces 292. In some embodiments, a protective cover screen 297 may be placed over the sensor 295, which is coupled with traces 292 and well or channels 300.

High resistance additive traces can be added to some substrates to create a heater. Such heaters can be useful applications that require higher temperatures (such as some biological applications).

In some embodiments, trenches can be made in certain areas or desired locations and then filled with optically transparent or tuned material to create optical waveguides for opto-electrical applications. Other trenches can be placed in certain areas of the substrate to isolate some areas from other areas for uses such as thermal isolation.

FIG. 4A illustrates a cross-sectional profile view of how a composite substrate 210 may be formed with a molded substrate portion 80 being formed on or over another conventional substrate 220. The conventional substrate 220 may be a PCB or other laminate material that may or may not comprise polyimide. In some instances, the conventional substrate 220 will remain (permanently) attached for structural support and additional connectivity. FIG. 4B, continuing from FIG. 4A, shows composite substrate 230 with an additional feature of first conductive pads or bumps 86 formed or disposed over the insulating, passivation, or dielectric layer 84, opposite the carrier or PCB 220. In some instances, as few as one layer of mold and grind may be used to form the molded substrate 80 over the conventional substrate or PCB 220 to expose a pad on the PCB, the pad being flush with the encapsulant 142 of the molded substrate 80. One or more components 60 may then be mounted (flip chip, face down, face up, or in any suitable way) to the composite substrate 210 or 230, as shown e.g., in FIG. 1A. The molded substrate 80 over the conventional substrate 220 may also be used to reduce a pitch of the routing or pads on the conventional substrate 220 to match a pitch or fan out pitch of the component 60. In some instances, arrangements of the molded substrate 80 or 220, or composite substrate 210 or 230, may be used to form a package on package (POP) structure. As a non-limiting example, the POP structure may include a first component 60 disposed face-up in the molded substrate 80, with a second component 60 flip-chip mounted over the first component 60. Any other desired POP arrangement may also be created using one or more components 60 and one or more molded substrate 80, 220 or one or more composite substrate 210, 230, 240, or 250.

Figure 5A:
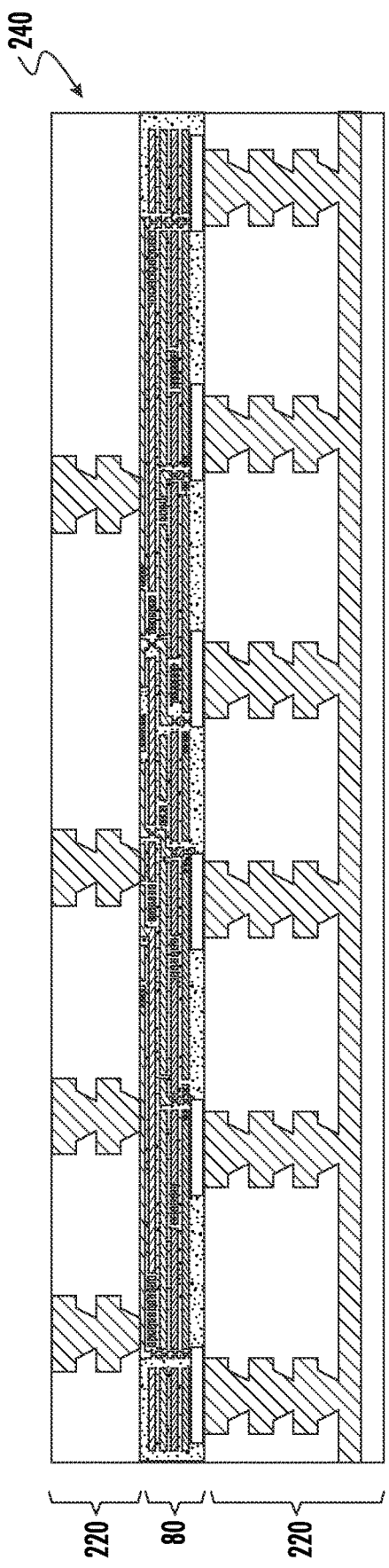
FIGS. 5A-5C illustrate instances of stacked layers of molded substrate and conventional substrate or PCB.
Figure 5B:
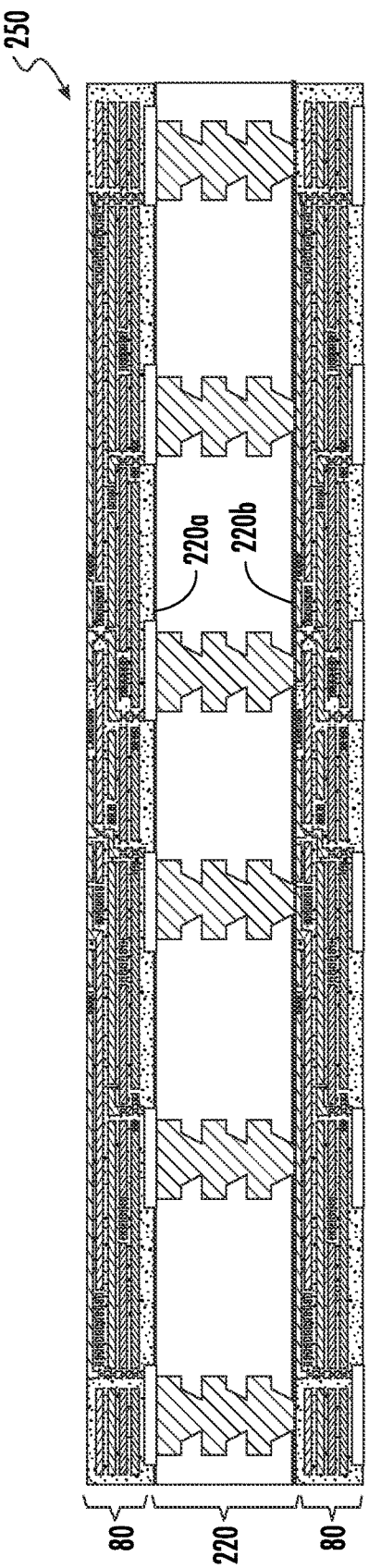

FIGS. 5A and 5B illustrate examples of the molded substrate 80 being formed as part of a combination substrate 240, 250 comprising a stack or sandwich 240, 250. The combination substrate 240, 250 may comprise two or more layers of molded substrate 80 interleaved with one or more layers of PCB or conventional substrate 200. Alternatively, the combination substrate 240, 250 may comprise two or more layers of PCB or conventional substrate 220 interleaved with one or more layers of molded substrate 80.

FIG. 5A illustrates a cross-sectional profile view of an aspect or embodiment of a combination molded substrate, PCB stack, or sandwich 240 in which the molded substrate 80 is sandwiched between two conventional substrates 220, such as PCBs as part of mechanically robust design that provides structural support for applications that need strong mechanical connections, such as passing drop tests, for military applications, and other similar situations. The composite or combination molded substrate 240 may be formed by forming a molded substrate 80 over a first conventional substrate 220 (similar to the process shown in FIGS. 2A-2V, after which a second conventional substrate 220 is mounted to or built up on the molded substrate 80. In various aspects, including those shown in FIGS. 5A and 5B, a consistent metal thickness may be present within the molded substrate 80 to provide improved performance and reliability. Additionally, the molded substrate 80 may provide finer pitch routing and higher density routing than would otherwise be included within a PCB. Other additional features, such as those presented in FIGS. 6A and 6B may also be present.

FIG. 5B illustrates a cross-sectional profile view of another aspect or embodiment of a combination molded substrate, PCB stack, or sandwich 250. The combination molded substrate 250 of FIG. 5B is the inverse of the combination molded substrate 240 of FIG. 5A. The combination molded substrate 250 of FIG. 5B includes two molded substrates 80 (upper and lower) formed on opposing first surface 220a and second surface 220b of conventional substrate 220, such as a PCB.

Figure 5C:
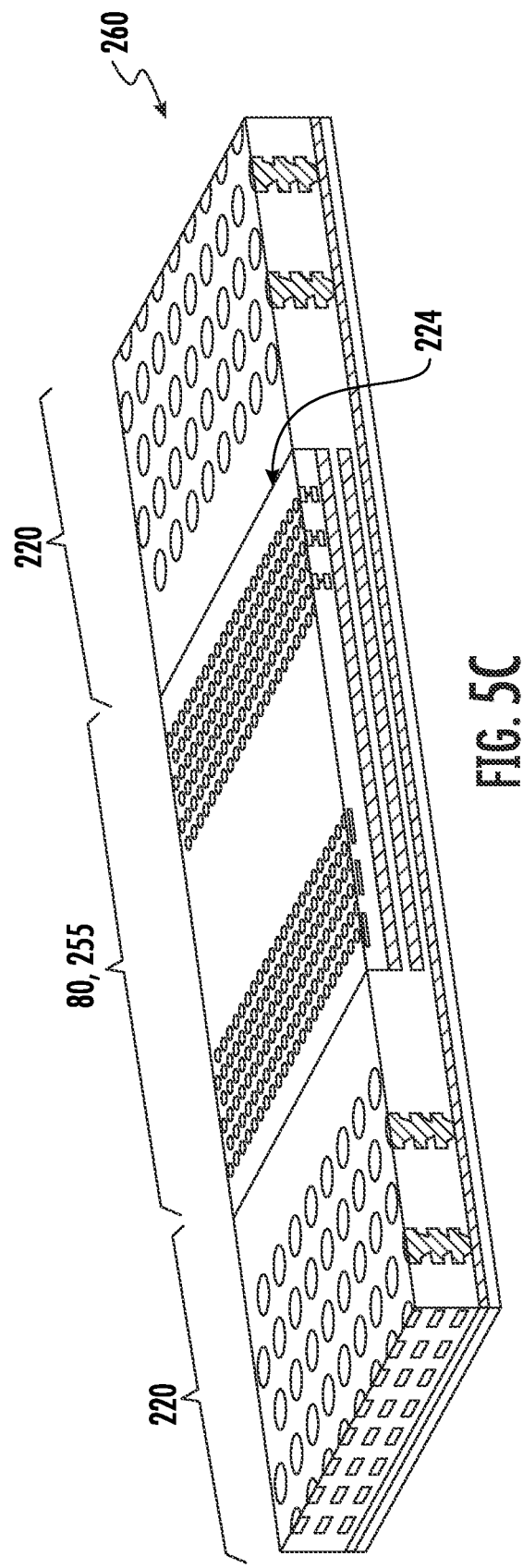

FIG. 5C illustrates a perspective view of a combination molded substrate 260 that incorporates a molded substrate 80 within an opening or window 224 formed within the conventional substrate 220, such as a PCB, so as to provide an island or region 255 of high-density interconnects within the substrate or PCB 220. In some instances, the window or opening 224 may go partially but not completely through the conventional substrate 220. In other instances, the window or opening 224 may go (or extend) completely through the conventional substrate 220. Any desirable arrangement of intermixing, filling stacking, or otherwise arranging molded substrates 80 and conventional substrates 220 may also be formed.

Figure 6A:
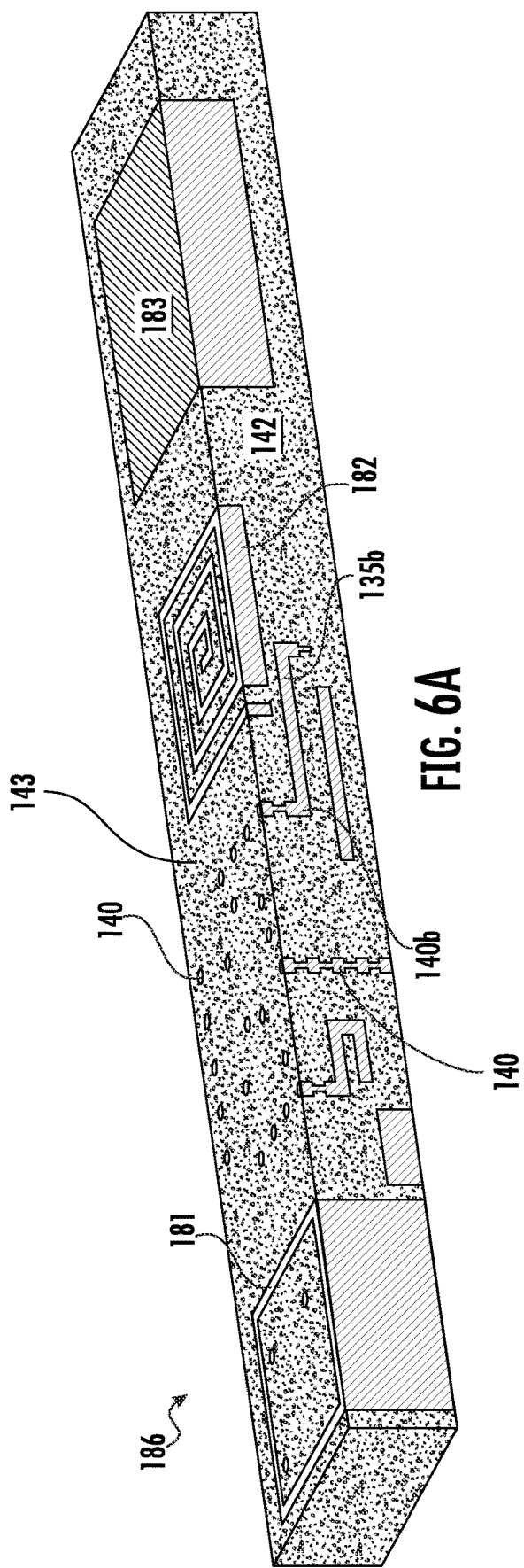
FIGS. 6A-6B illustrate close-up perspective views of molded build-up interconnect structures.
Figure 6B:
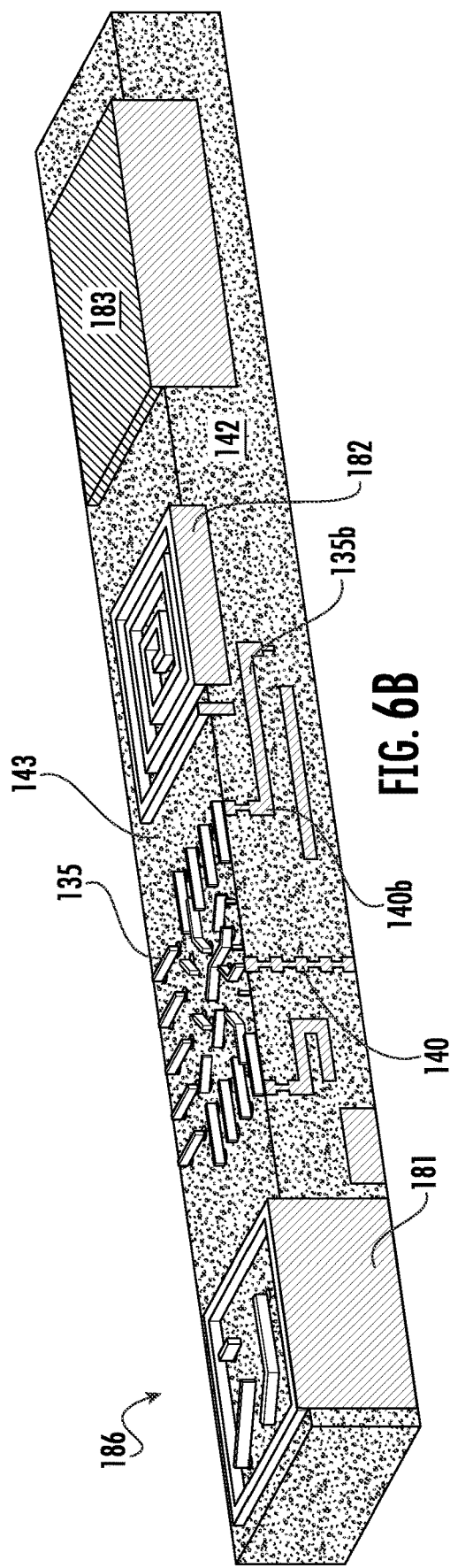

FIGS. 6A and 6B illustrate close-up perspective views of molded build-up interconnect structure 186 with the mold compound 142 contacting, disposed around, and supporting a number of features or elements. FIGS. 6A and 6B show plating various shapes or features across multiple layers, including (moving from left to right): (i) a box shield 181 (for shielding interference and undesired RF or EM signals), as shown a the left of the figure, (ii) conductive stumps or studs 140 stacked and interconnecting with or without routing or RDLs 135, (iii) an inductor 182, and (iv) on the right of the figure a power delivery or thermal dissipation structure 183. FIG. 6A also shows the second conductive layer 135b contacting second conductive contacts 140b.

FIG. 6B illustrates an additional conductive layer 135 being formed over the upper planar surface 143 of encapsulant 142 and conductive material 135.

In forming a molded substrate 80, 210, 220, or 230 there may be an encapsulating step for every conductive layer formed. Alternatively, a single encapsulant 142 may encapsulate more than one conductive layer 135 or vertical conductive contact 140 at a time such as encapsulating multiple conductive layers 135 which may form, comprise, or be a part of multiple different shapes and features (e.g., short features, medium features, and long or tall features), following which a grind step with grinder 129 may expose tall features while medium and short features are not exposed and remain covered by the encapsulant.

This disclosure, its aspects, and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise one or more of any components, models, types, materials, versions, quantities, and the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

While this disclosure includes a number of embodiments in different forms, the particular embodiments presented are with the understanding that the present disclosure is to be considered as an exemplification of the principles of the disclosed structures, devices, methods, and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

The above features and disclosure will be further understood in light of the claims included below.

What is claimed is:

1. A method of making a molded substrate, comprising:
   providing a carrier;
   forming a first conductive layer disposed over the carrier;
   forming first vertical conductive contacts on the first conductive layer;
   disposing a first layer of encapsulant over the first conductive layer and contacting at least a portion of sides of the first vertical conductive contacts;
   planarizing the first vertical conductive contacts and the first layer of encapsulant, by grinding or polishing, to form a first planar surface;
   forming a second conductive layer over the first layer of encapsulant and forming second vertical conductive contacts on the second conductive layer and configured to be electrically coupled with the first conductive layer and first vertical conductive contacts, wherein and at least a portion of the second conductive layer is formed as a conductive trace coupled to at least one of the first vertical conductive contacts such that the conductive trace is narrower in at least one direction than a greatest width of the at least one vertical conductive contact;
   disposing a second layer of encapsulant over the second conductive layer and contacting at least a portion of sides the second vertical conductive contacts; and
   planarizing the second vertical conductive contacts and the second layer of encapsulant, by grinding or polishing, to form a second planar surface;
   wherein the molded substrate is formed without an active embedded device disposed within the molded substrate.

2. The method of claim 1, wherein the first encapsulant and second encapsulant are mold compounds that are disposed by a molding process.

3. The method of claim 1, wherein the carrier comprises a permanent carrier which remains coupled with the molded substrate.

4. The method of claim 3, wherein:
   the carrier comprises a printed circuit board (PCB) or conventional substrate;
   the molded substrate is electrically coupled with the PCB or conventional substrate; and
   the molded substrate comprises a finer pitch or denser routing than the PCB or conventional substrate.

5. The method of claim 1, wherein the molded substrate is formed as part of a combination substrate comprising:
   two or more layers of molded substrate interleaved with one or more layers of PCB or conventional substrate; or
   two or more layers of PCB or conventional substrate interleaved with one or more layers of molded substrate.

6. The method of claim 1, further comprising forming alternating layers of additional conductive layers and vertical conductive contacts with alternating layers of encapsulant to form up to 12 layers of conductive layers and 12 layers of vertical conductive contacts.

7. The method of claim 1, further comprising:
   forming first conductive bumps configured to be electrically coupled through one or more of the vertical conductive contacts; and
   wherein the first conductive bumps comprise one or more of an input electrical contact, an output electrical contact, an IO contact, a bump, a solder ball, a solder bump, a BGA, a LGA, land pads, copper pillars, and copper pillars with solder, to couple with devices outside the semiconductor device.

8. The method of claim 1, wherein the encapsulant comprises a mold compound, a composite material such as epoxy resin with filler, epoxy acrylate with filler, polytetrafluoroethylene, or other low k dielectrics, and the encapsulant is not a polymer material that does not perform well in a grinding operation.

9. The method of claim 1, wherein the vertical conductive contacts are formed with a minimum diameter less than or equal to 12 μm and at a minimum pitch of less than or equal to 25 μm.

10. The method of claim 1, wherein the first conductive layer comprises a redistribution layer (RDL) with a minimum line and space width of less than or equal to 5 μm.

11. The method of claim 1, wherein the first planar surface and the second planar surface are planarized to within 5 to 400 nanometers over a characteristic measurement distance.

12. The method of claim 1, further comprising forming one or more of the first conductive layer and the second conductive layer to further comprise one or more power planes, thermal delivery system, a power delivery system, a ground plane, shielding for all or part of the substrate, patterned metal in any shape, including for inductors, passive components, antennas, and markings for identification.

13. The method of claim 1, further comprising a molded substrate formed on opposing sides of the carrier.

14. The method of claim 13, further comprising forming each of the molded substrates on opposing sides of the carrier with 1-8 layers of conductive material.

15. The method of claim 1, further comprising the molded substrate formed with an embedded bridge chip.

16. A method of making a molded substrate, comprising:
    providing a carrier;
    forming a first conductive layer over the carrier, including patterning the first conductive layer;
    forming first vertical conductive contacts on the first conductive layer;
    disposing a first layer of encapsulant around the first conductive layer and first vertical conductive contacts; and
    planarizing the first vertical conductive contacts and the first layer of encapsulant to form a first planar surface;
    wherein at least a portion of a second conductive layer is formed as a conductive trace coupled to at least one of the first vertical conductive contacts such that the conductive trace is narrower in at least one direction than a greatest width of the at least one vertical conductive contact and the molded substrate is formed without an active embedded device disposed within the molded substrate.

17. The method of claim 16, further comprising planarizing the first vertical conductive contacts and the first layer of encapsulant by grinding or polishing to form a planar surface that is planarized to within 5 to 400 nanometers over a characteristic measurement distance.

18. The method of claim 16, further comprising forming the first conductive layer to further comprise one or more large power planes, a power delivery system, shielding for all or part of the substrate, a ground plane, patterned metal in any shape, including for inductors, antennas, and markings for identification.

19. The method of claim 16, further comprising forming first conductive bumps over the first planar surface, opposite the carrier.

20. The method of claim 16, wherein the first vertical conductive contacts are formed with a minimum diameter less than or equal to 12 μm and at a minimum pitch of less than or equal to 25 μm.

21. The method of claim 16, wherein the carrier comprises a permanent carrier which remains coupled with the molded substrate.

22. The method of claim 21, wherein the carrier comprises a printed circuit board (PCB).

23. The method of claim 16, further comprising forming a conductive bump configured to be electrically coupled through one or more of the vertical conductive contacts.

24. The method of claim 16, further comprising forming alternating layers of additional conductive layers and vertical conductive contacts with alternating layers of encapsulant to form up to 12 layers of conductive layers and 12 layers of vertical conductive contacts.

25. The method of claim 16, wherein the first conductive bumps comprise one or more of an input electrical contact, an output electrical contact, an IO contact, a bump, a solder ball, a solder bump, a BGA, a LGA, land pads, copper pillars, and copper pillars with solder, to couple with devices outside the semiconductor device.

26. The method of claim 16, further comprising forming second conductive bumps on an opposite side of the molded substrate from the first conductive bumps.

27. The method of claim 16, wherein the encapsulant comprises a mold compound, a composite material, such as epoxy resin with filler, epoxy acrylate with filler, polytetrafluoroethylene, or other low k dielectrics, and is not a polymer material that does not perform well in a grinding operation.

28. The method of claim 24, wherein one or more layers of encapsulant are mold compounds or are provided by a molding process.

* * * * *